(12) United States Patent
Herron et al.

(10) Patent No.: US 6,983,405 B1
(45) Date of Patent: Jan. 3, 2006

(54) METHOD AND APPARATUS FOR TESTING CIRCUITRY EMBEDDED WITHIN A FIELD PROGRAMMABLE GATE ARRAY

(75) Inventors: Nigel G. Herron, San Jose, CA (US); Eric J. Thorne, Santa Cruz, CA (US); Qingqi Wang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 641 days.

(21) Appl. No.: 09/991,412

(22) Filed: Nov. 16, 2001

(51) Int. Cl.
*G01R 31/28* (2006.01)

(52) U.S. Cl. ..................................... 714/726; 714/725

(58) Field of Classification Search ............... 714/729, 714/30, 727, 726, 733, 735, 742, 725; 716/16, 716/4
See application file for complete search history.

(56) References Cited

U.S. PATENT DOCUMENTS

| | | |
|---|---|---|
| 4,758,985 A | 7/1988 | Carter |
| 4,855,669 A | 8/1989 | Mahoney |
| 5,072,418 A | 12/1991 | Boutaud et al. |
| 5,142,625 A | 8/1992 | Nakai |
| RE34,363 E | 8/1993 | Freeman |
| 5,274,570 A | 12/1993 | Izumi et al. |
| 5,311,114 A | 5/1994 | Sambamurthy et al. |
| 5,339,262 A | 8/1994 | Rostoker et al. |
| 5,347,181 A | 9/1994 | Ashby et al. |
| 5,361,373 A | 11/1994 | Gilson |
| 5,457,410 A | 10/1995 | Ting |
| 5,473,267 A | 12/1995 | Stansfield |
| 5,500,943 A | 3/1996 | Ho et al. |
| 5,504,738 A | 4/1996 | Sambamurthy et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,574,930 A | 11/1996 | Halverson, Jr. et al. |
| 5,574,942 A | 11/1996 | Colwell et al. |
| 5,581,745 A | 12/1996 | Muraoka |
| 5,592,493 A * | 1/1997 | Crouch et al. ............... 714/729 |
| 5,600,845 A | 2/1997 | Gilson |
| 5,652,904 A | 7/1997 | Trimberger |

(Continued)

FOREIGN PATENT DOCUMENTS

EP 0315275 A2 10/1989

(Continued)

OTHER PUBLICATIONS

Cary D. Synder and Max Baron; "Xilinx's A-to-Z System Platform"; Cahners Microprocessor; The Insider's Guide to Microprocessor Hardware; Microdesign Resources; Feb. 26, 2001; pp. 1-5.

(Continued)

*Primary Examiner*—David Ton
(74) *Attorney, Agent, or Firm*—James Harrison; LeRoy D. Maunu; H. C. Chan

(57) ABSTRACT

A circuit that includes a core device that is embedded within fixed interfacing logic circuitry that, in turn, is embedded in an FPGA fabric. The FPGA fabric may be configured into a test mode of operation to test either the embedded device or fixed logic devices formed within the fixed interfacing logic. While the FPGA is configured in a test mode, test circuitry and communication paths are made present within the fixed interfacing logic circuitry to facilitate the testing. Additionally, the test circuitry comprises isolation circuitry that is formed between various modules and circuits that are to be tested to isolate the device under test and to produce test signals thereto and therefrom during testing operations.

21 Claims, 25 Drawing Sheets

U.S. PATENT DOCUMENTS

| | | | |
|---|---|---|---|
| 5,671,355 A | 9/1997 | Collins | |
| 5,675,589 A * | 10/1997 | Yee | 714/30 |
| 5,705,938 A | 1/1998 | Kean | |
| 5,732,250 A | 3/1998 | Bates et al. | |
| 5,737,631 A | 4/1998 | Trimberger | |
| 5,740,404 A | 4/1998 | Baji | |
| 5,742,179 A | 4/1998 | Sasaki | |
| 5,742,180 A | 4/1998 | DeHon et al. | |
| 5,748,979 A | 5/1998 | Trimberger | |
| 5,752,035 A | 5/1998 | Trimberger | |
| 5,760,607 A | 6/1998 | Leeds et al. | |
| 5,809,517 A | 9/1998 | Shimura | |
| 5,835,405 A | 11/1998 | Tsui et al. | |
| 5,862,152 A * | 1/1999 | Handly et al. | 714/727 |
| 5,867,507 A * | 2/1999 | Beebe et al. | 714/726 |
| 5,874,834 A | 2/1999 | New | |
| 5,889,788 A | 3/1999 | Pressly et al. | |
| 5,892,961 A | 4/1999 | Trimberger | |
| 5,914,616 A | 6/1999 | Young et al. | |
| 5,914,902 A | 6/1999 | Lawrence et al. | |
| 5,933,023 A | 8/1999 | Young | |
| 5,970,254 A | 10/1999 | Cooke et al. | |
| 6,011,407 A | 1/2000 | New | |
| 6,020,755 A | 2/2000 | Andrews et al. | |
| 6,021,513 A * | 2/2000 | Beebe et al. | 714/726 |
| 6,026,481 A | 2/2000 | New et al. | |
| 6,096,091 A | 8/2000 | Hartmann | |
| 6,154,051 A | 11/2000 | Nguyen et al. | |
| 6,163,166 A | 12/2000 | Bielby et al. | |
| 6,172,990 B1 | 1/2001 | Deb et al. | |
| 6,178,541 B1 | 1/2001 | Joly et al. | |
| 6,181,163 B1 | 1/2001 | Agrawal et al. | |
| 6,211,697 B1 | 4/2001 | Lien et al. | |
| 6,242,945 B1 | 6/2001 | New | |
| 6,272,451 B1 | 8/2001 | Mason et al. | |
| 6,279,045 B1 | 8/2001 | Muthujumaraswathy et al. | |
| 6,282,627 B1 | 8/2001 | Wong et al. | |
| 6,301,696 B1 | 10/2001 | Lien et al. | |
| 6,343,207 B1 | 1/2002 | Hessel et al. | |
| 6,353,331 B1 | 3/2002 | Shimanek | |
| 6,356,987 B1 | 3/2002 | Aulas | |
| 6,389,558 B1 | 5/2002 | Herrmann et al. | |
| 6,434,735 B1 * | 8/2002 | Watkins | 716/16 |
| 6,460,172 B1 | 10/2002 | Insenser Farre et al. | |
| 6,467,009 B1 | 10/2002 | Winegarden et al. | |
| 6,507,942 B1 | 1/2003 | Calderone et al. | |
| 6,510,548 B1 | 1/2003 | Squires | |
| 6,518,787 B1 | 2/2003 | Allegrucci et al. | |
| 6,519,753 B1 | 2/2003 | Ang | |
| 6,522,167 B1 | 2/2003 | Ansari et al. | |
| 6,532,572 B1 | 3/2003 | Tetelbaum | |
| 6,539,508 B1 | 3/2003 | Patrie et al. | |
| 6,541,991 B1 | 4/2003 | Horncheck et al. | |
| 6,587,995 B1 | 7/2003 | Duboc et al. | |
| 6,588,006 B1 | 7/2003 | Watkins | |
| 6,601,227 B1 | 7/2003 | Trimberger | |
| 6,604,228 B1 | 8/2003 | Patel et al. | |
| 6,611,951 B1 | 8/2003 | Tetelbaum et al. | |
| 6,829,751 B1 * | 12/2004 | Shen et al. | 716/4 |
| 2001/0049813 A1 | 12/2001 | Chan et al. | |
| 2003/0062922 A1 | 4/2003 | Douglass et al. | |

FOREIGN PATENT DOCUMENTS

| | | |
|---|---|---|
| EP | 0 905 906 A2 | 3/1999 |
| EP | 1 235 351 A1 | 8/2002 |
| WO | WO 93 25968 A1 | 12/1993 |

OTHER PUBLICATIONS

U.S. Appl. No. 09/991,410, filed Nov. 16, 2001, Herron et al.

Sayfe Kiaei et al., "VLSI Design of Dynamically Reconfigurable Array Processor-Drap," IEEE, Feb. 1989, pp. 2484-2488, V3.6, IEEE, 3 Park Avenue, 17th Floor, New York, NY 10016-5997.

Vason P. Srini, "Field Programmable Gate Array (FPGA) Implementation of Digitial Systems: an Alternative to ASIC," IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1-3.2.4, IEEE, 2 Park Avenue, 17th Floor, New York, NY 10016-5997.

Christian Iseli et al., "Beyond Superscaler Using FPGA's," IEEE, Apr. 1993, pp. 486-490, IEEE, 3 Park Avenue, 17th Floor, New York, NY 10016-5997.

P.C. French et al.,"A Self-Reconfiguring Processor,"; IEEE, Jul. 1993, pp. 50-59, IEEE, 3 Park Avenue, 17th Floor, New York, NY 10016-5997.

Christian Iseli et al., "Spyder: A Reconfigurable VLIW Processor Using FPGA's," IEEE, Jul. 1993, pp. 17-24, IEEE, 3 Park Avenue, 17th Floor, New York, NY 10016-5997.

Michael J. Wirthlin et al., "The Nano Processor: a Low Resource Reconfigurable Processor," IEEE, Feb. 1994, pp. 23-30, IEEE, 3 Park Avenue, 17th Floor, New York, NY 10016-5997.

Williams S. Carter, "The Future of Programmable Logic and Its Impact on Digital System Design," Apr. 1994, IEEE, pp. 10-16, IEEE, 3 Park Avenue, 17th Floor, New York, NY 10016-5997.

Andre' Dehon, "DPGA-Coupled Microprocessors: Commodity ICs for the Early 21st Century,"IEEE, Feb. 1994, pp. 31-39, IEEE, 3 Park Avenue, 17th Floor, New York, NY 10016-5997.

Osama T. Albaharna, "Area & Time Limitations of FPGA-Based Virtual Hardware," IEEE, Apr. 1994, pp. 184-189, IEEE, 3 Park Avenue, 17th Floor, New York, NY 10016-5997.

U.S. Appl. No. 09/968,446, filed Sep. 28, 2001, Douglass et al.

*Xilinx, Inc.*, "The Programmable Logic Data Book," 1994, Revised 1995, Xilinx, Inc., 2100 Logic Drive, San Jose, CA. 95124.

*Xilinx, Inc.*, "The Programmable Logic Data Book," 1994, Revised 1995, pp 2-109 to 2-117, Xilinx, Inc., 2100 Logic Drive, San Jose, CA. 95124.

*Xilinx, Inc.*, "The Programmable Logic Data Book," 1994, Revised 1995, pp 2-9 to 2-18; 2-187 to 2-199, Xilinx, Inc., 2100 Logic Drive, San Jose, CA. 95124.

*Xilinx, Inc.*, "The Programmable Logic Data Book," 1994, Revised 1995, pp 2-107 to 2-108, Xilinx, Inc., 2100 Logic Drive, San Jose, CA. 95124.

Christian Iseli et al., "AC++Compiler for FPGA Custom Execution Units Synthesis," 1995, pp. 173-179, IEEE, 3 Park Avenue, 17th Floor, New York, NY 10016-5997.

*International Business Machines*, "PowerPC 405 Embedded Processor Core User Manual," 1996, 5th Ed., pp. 1-1 to X-16, International Business Machines, 1580 Rout 52, Bldg. 504, Hopewell Junction, NY 12533-6531.

Yamin Li et al., "Aizup-a Pipelined Processor Design & Implementation on Xilinx FPGA Chip," IEEE, Sep. 1996, pp 98-106, 98-106, IEEE, 3 Park Avenue, 17th Floor, New York, NY 10016-5997.

Ralph D. Wittig et al., Onechip: an FPGA Processor With Reconfigurable Logic, Apr. 17, 1996, pp 126-135, IEEE, 3 Park Avenue, 17th Floor, New York, NY 10016-5997.

*Xilinx, Inc.*, "The Programmable Logic Data Book," Jan. 27, 1999, Ch. 3, pp 3-1 to 3-50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183-186, IEEE, 3 Park Avenue, 17th Floor, New York, NY 10016-5997.

*Xilinx, Inc.*, "The Programmable Logic Data Book," 2000, Ch. 3 pp 3-1 to 3-117, Xilinx, Inc., 2100 Logic Drive, San Jose, CA 95124.

U.S. Appl. No. 09/917,304, filed Jul. 27, 2001, Douglass et al.

U.S. Appl. No. 09/861,112, filed May 18, 2001, Dao et al.

U.S. Appl. No. 09/858,732, filed May 15, 2001, Schulz.

*Xilinx, Inc.*, "The Programmable Logic Data Book," 2000, Ch 3, pp 3-7 to 3-17, 3-76 to 3-87, Xilinx, Inc., 2100 Logic Drive, San Jose, CA. 95124.

*International Business Machines*, "Processor Local Bus" Architecture Specifications, 32-Bit Implementation, Apr. 2000, First Edition, V2.9, pp. 1-76, IBM Corporation, Department H83A, P.O. Box 12195, Research Triangle Park, NC 22709.

*Xilinx, Inc.*, Virtex II Platform FPGA Handbook, Dec. 6, 2000, v1.1, pp. 33-75, Xilinx, Inc., 2100 Logic Drive, San Jose, CA. 95124.

\* cited by examiner

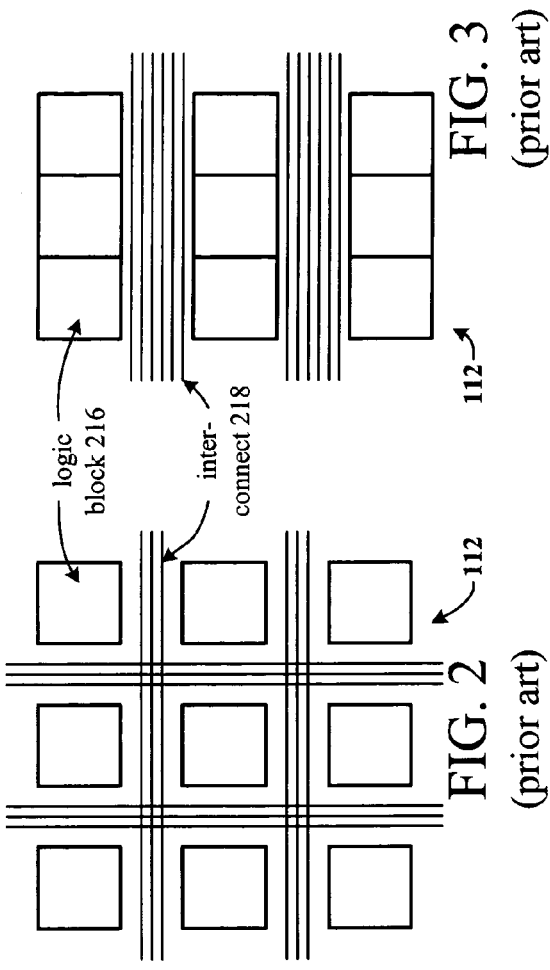
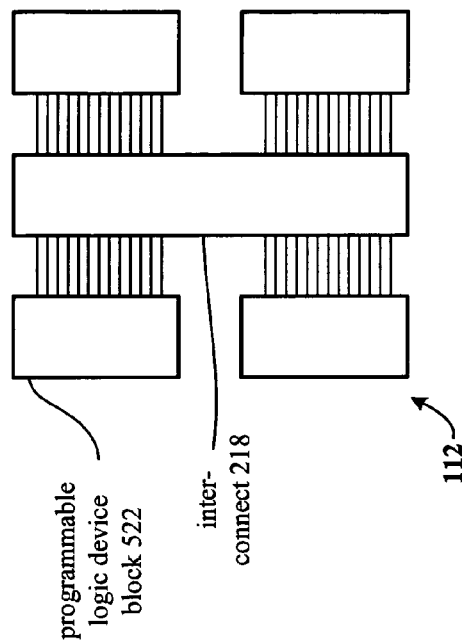
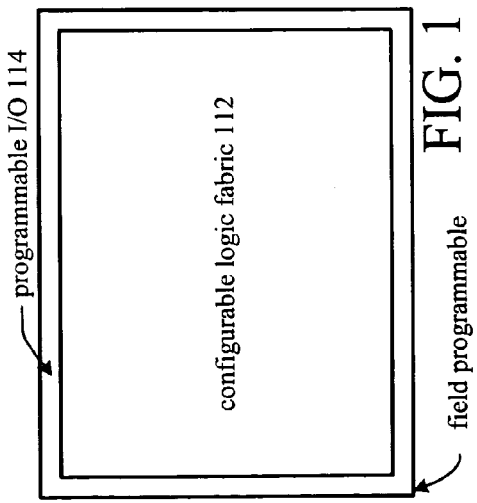
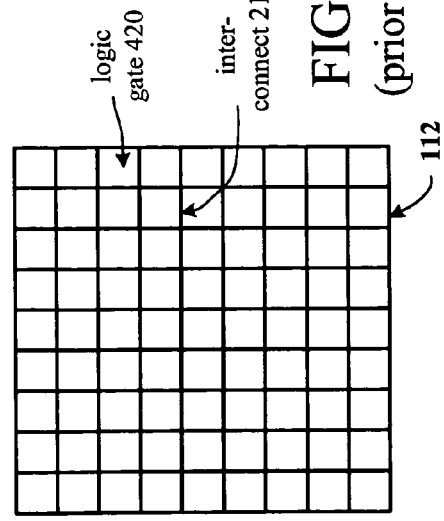

METHOD AND APPARATUS FOR TESTING CIRCUITRY EMBEDDED WITHIN A FIELD PROGRAMMABLE GATE ARRAY

BACKGROUND

1. Technical Field

The present invention relates to systems and methods for Field Programmable Gate Arrays (FPGAs) and, more particularly, to systems and methods for testing FPGAs.

2. Related Art

Field Programmable Gate Arrays (FPGAs), Application Specific Integrated Circuits (ASICs) and microprocessor circuits are known, and have been used, according to performance requirements for a given circuit. For example, microprocessors are often preferred when flexibility and variable control are key design considerations. On the other hand, ASICs are often selected when performance or small circuit size is essential. FPGAs are often used when programmability and performance are important. Heretofore, however, FPGAs have typically been made to include only selectable logic blocks and have not included designs for robust processing of data. FPGAs have become very popular for telecommunication applications, Internet applications, switching applications, routing applications, etc.

FIG. 1 illustrates a generic schematic block diagram of an FPGA 110. The FPGA 110 includes configurable logic fabric 112 (containing programmable logic gates and programmable interconnects) and configurable input/output blocks 114. The configurable input/output blocks 114 are fabricated on the perimeter of a substrate supporting the FPGA 110 and coupling to the pins of the integrated circuit to allow access to the configurable logic fabric 112.

The logic fabric 112 may be configured to perform a wide variety of functions corresponding to particular end user applications. For example, the configurable logic fabric 112 may be configured in a symmetric array arrangement, a row-based arrangement, a column based arrangement, a hierarchical programmable logic device arrangement, or a sea-of-gates arrangement, each having different functional advantages.

FIG. 2 illustrates the logic fabric 112 configured in a symmetrical array arrangement. Each logic block 216 of a plurality of logic blocks 216 is configured (usually by the end user) as an array of rows and columns to perform a specific logic function. More complex logic functions may be obtained by interconnecting individually configured logic blocks using a plurality of programmable interconnections 218. Accordingly, programmable interconnections 218 are formed between each of the logic blocks of each row and each column.

Programmable interconnections 218 also provide selective connectivity between each logic block of the array of logic blocks 216 and the configurable input/output blocks 114. Programmable interconnections 218 may be formed using static random access memory (RAM) cell technology, anti-fuse cell technology, EPROM transistor technology, and/or EEPROM transistor technology. If the FPGA utilizes static RAM programmable connections, the connections are made using pass transistors, transmission gates, and/or isolation circuits that are controlled by the static RAM cells.

If the FPGA utilizes anti-fuse interconnections, the interconnections typically reside in a high impedance state and can be configured into a low impedance state, or fused state, to provide the selective connectivity. If the FPGA utilizes EPROM or EEPROM based interconnections, the interconnection cells may be configured, thus allowing the FPGA to be reconfigured.

FIG. 3 illustrates a schematic block diagram of the configurable logic fabric 112 being implemented in a row-based arrangement. In this configuration, the logic fabric 112 includes a plurality of logic blocks 216 arranged in rows. Between each row of the logic blocks are programmable interconnections 218. Programmable interconnections 218 may be implemented utilizing static RAMs, dynamic RAMS and NVRAM, EPROM technology, and/or EEPROM technology.

FIG. 4 illustrates a schematic block diagram of the logic fabric 112 being configured in a sea-of-gates configuration. The logic blocks and programmable interconnections are substantially similar to that described above.

FIG. 5 illustrates the configurable logic fabric 112 being implemented as a hierarchical logic device. In this implementation, the configurable logic fabric 112 includes logic device blocks 522 and programmable interconnections 218. As shown, four logic device blocks 522 are in the corners with an interconnect 218 in the middle of the logic device blocks. In addition, the interconnects include lines coupling the configurable logic device blocks 522 to the interconnect 218. As such, the logic device blocks 522 may be configured to operate singularly or in combination with other logic blocks 522 according to the programming of the programmable interconnections 218.

As is known, field programmable gate arrays offer the end user the flexibility of implementing custom integrated circuits while avoiding the initial cost, time delay and inherent risk of application specific integrated circuits (ASIC). They also provide a degree of hardware-based customization that does not require custom application-specific designs, such as ASICs.

While FPGAs have these advantages, there are some disadvantages. For instance, an FPGA configured to perform a similar function as implemented in an ASIC, sometimes can require significantly more die area than the ASIC. The manufacturing expense of an FPGA, therefore, is greater than that of an ASIC. Additionally, FPGA performance is sometimes lower than that of an ASIC.

To mitigate some of the disadvantages of FPGAs with respect to ASICs, some FPGA manufacturers are including ASIC-like functions on the same substrate as the configurable logic fabric. For example, FPGAs are now commercially available that include RAM blocks and/or multipliers in the configurable logic fabric 112. As such, the logic fabric 112 does not have to be configured to perform RAM functions and/or multiplier functions when such functions are needed. Thus, for these functions, significantly less die area is needed within the FPGA.

There are designs presently being developed to incorporate embedded microprocessors and other similar and known devices into an FPGA fabric by the present Assignee. As these designs mature, there will exist a need to provide for testing of the devices in a manner that enables one to determine whether the FPGA is formed and operating correctly, as well as, the processor or other device that is embedded there within.

Testers for testing integrated circuits are well known. Typically, a tester has local sequencers, each of which is programmable to establish operational logic states or a specified set of electrical conditions so that, with the input of data, an expected output may be compared to an actual output to determine proper operation of the device under test (DUT). In such systems, each local sequencer generates input data signals (events) for the DUT with reference to a global clock or other reference signals. Typically, sequencers are arranged and formed to present multiple test vectors to the (DUT). The sequencers further include memory and processing logic to provide the test vectors for testing the device.

Testers provide stimulus patterns for the DUT to prompt it to produce an expected output result with respect to the data transmitted to it for evaluation. Thereafter, the expected output is compared to an actual output to determine whether the DUT passed the test. In addition to testers, the use of scan latches to emulate pin connections is generally known. The scan latches are loaded with test signals prior to a clock pulse being generated to prompt the device to process the information stored in the scan latches. A discussion of this technology in general terms may be found in the text Abramovici, Breuer and Friedman, *Digital System Testing and Testable Design*, (IEEE 1990).

The foregoing discussion of test vectors and test data patterns relates to devices for which pin access is not a problem. In an environment in which the device under test is embedded in a system, such as an FPGA fabric, providing stimulus patterns are not an achievable task without significant and, perhaps, unreliable, manipulation of the surrounding circuitry to produce the desired stimulus patterns and data inputs for testing the device. Accordingly, it is difficult to reliably and relatively easily provide the test vectors and test data to embedded devices within an FPGA fabric as part of running known test procedures.

What is needed, therefore, is a method and apparatus that enables one to test specific circuit components embedded within an FPGA by providing signals and measuring responses there from.

SUMMARY OF THE INVENTION

According to the present invention, test circuitry and operational methods that are formed within an FPGA device are to support the testing of embedded fixed logic core devices as well as fixed logic devices created within an interfacing logic portion that forms an interface between the embedded fixed logic core device and an FPGA fabric portion. The embedded fixed logic core device may be a processor or any other known fixed logic device. The test circuitry includes interconnect circuitry and test logic circuitry formed within the interfacing logic portion of the FPGA. Conceptually, the interfacing logic portion of the FPGA is often referred to as the "gasket" and is constructed in a manner similar to the construction (design and manufacture) of ASICs. The inventive methods include configuring logic circuitry with the FPGA fabric portion to assist in testing the fixed logic core device as well as the fixed logic devices formed within the gasket. During testing operations, the FPGA fabric is configured to form scan latches to become a scan chain containing test vectors. The test vectors are applied via the test circuitry within the gasket to the input/output pins or ports of the fixed logic core device or to the fixed logic device formed within the gasket that is being tested.

The test circuitry within the gasket further includes isolation circuit elements that allow the FPGA fabric (as configured for testing) to have direct access to the input/output of the device under test whether it is the fixed logic device formed within the gasket or an embedded core processor. An FPGA fabric that is configured for testing can perform structural tests for a specific device because the necessary access to the device inputs and outputs are provided, at least in part, by test circuitry formed within the gasket. Because test vectors or signals may be provided to the embedded device(s) as well as the fixed logic circuitry, structural testing of the entire FPGA is supported thereby enabling a tester to determine with a large degree of certainty whether the FPGA is operational.

In the described embodiment of the invention, the logic within the FPGA fabric that may be configured for testing may also be configured for normal operation while the testing is not taking place. In an alternate embodiment, however, logic circuitry is formed within the FPGA fabric exclusively for test processes and purposes. The manner in which the logic of the FPGA may be configured for test or normal operation is known by one of the ordinary skill in the art.

In the described embodiments of the invention, interfacing logic (gasket logic) interfaces the embedded fixed logic core device to the FPGA fabric as is described herein. While the testing of the FPGA fabric is a generally known task, testing of the gasket logic and embedded core devices is not known. Thus, according to a second aspect of the present invention, the gasket logic includes specialized testing configurations that facilitate testing of the gasket logic as well as the embedded core. There potentially are thousands of different configurations that correspond to the specific device under test.

As was the case with the testing of the fixed logic core device, the FPGA fabric is also configurable to test the gasket logic. According to one embodiment of a testing operation, the FPGA fabric is configured to generate scan chains that may be used to generate test vectors for testing the gasket logic. The FPGA fabric is also configured to receive output vectors produced by the gasket logic and to evaluate the test results by comparing these output vectors to expected results.

The output test vectors, in the described embodiments of the invention, are evaluated differently according to whether they originated from the embedded fixed logic device or the gasket logic (interfacing logic). Test vectors output from the embedded fixed logic device are produced to an external system for evaluation (e.g., a tester) while the output test vectors from the gasket logic are evaluated on the chip itself by logic within the FPGA fabric. In an alternate embodiment, however, the test vectors from the FPGA fabric also are evaluated externally from the chip. In yet another embodiment, all output test vectors are evaluated on chip.

The present invention is advantageous in that it solves the problem of how to test an embedded device as well as the interfacing logic between the embedded device and the fabric portion of an FPGA. Forming scan chains with test vectors, for example, to test an ASIC (e.g., the gasket logic and its embedded components), as well as to test an embedded device that is embedded within an ASIC, not only solves connection issues, but also makes it possible to develop an embedded system, as in the described embodiments of the invention. Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which:

FIG. 1 illustrates a schematic block diagram of a prior art field programmable gate array;

FIG. 2 illustrates a schematic block diagram of the configurable logic fabric of the programmable gate array of FIG. 1 configured in a symmetrical array;

FIG. 3 illustrates a schematic block diagram of the logic fabric of the programmable gate array of FIG. 1 in a row based configuration;

FIG. 4 illustrates a schematic block diagram of the logic fabric of the programmable gate array of FIG. 1 in a sea-of-gates configuration;

FIG. 5 illustrates a schematic block diagram of the logic fabric of the programmable gate array of FIG. 1 in a hierarchical programmable logic device configuration;

DETAILED DESCRIPTION OF THE DRAWINGS

Generally, the present invention provides interconnecting logic that interfaces an embedded fixed logic circuit, or circuits, with configurable logic fabric of a field programmable gate array. The interconnecting logic enables any fixed logic circuit (e.g., a digital signal processor, microprocessor, physical layer interface, link layer interface, network layer interface, audio processor, video graphics processor, and/or applications-specific integrated circuit) to be embedded within the configurable logic fabric of a field programmable gate array. In addition, the interconnecting logic provides connectivity between the fixed logic circuit and the configurable logic fabric such that the fixed logic circuit functions are an extension of the configurable logic fabric.

The interconnecting logic includes interconnecting tiles and may further include interfacing logic. The interconnecting tiles provide selective connectivity between inputs and/or outputs of the fixed logic circuit and the interconnects or programmable interconnections of the configurable logic fabric. The interfacing logic, when activated to be electrically present, provides logic circuitry that conditions data transfers between the fixed logic circuit and the configurable logic fabric. The conditioning of the data may be format changes, parallel-to-serial conversion, serial-to-parallel conversion, multiplexing, de-multiplexing, performing Boolean logic functions, etc. With such interconnecting logic, any fixed logic circuit may be readily embedded within a programmable gate array to provide additional functionality to the end users of FPGAs.

Figure 6:
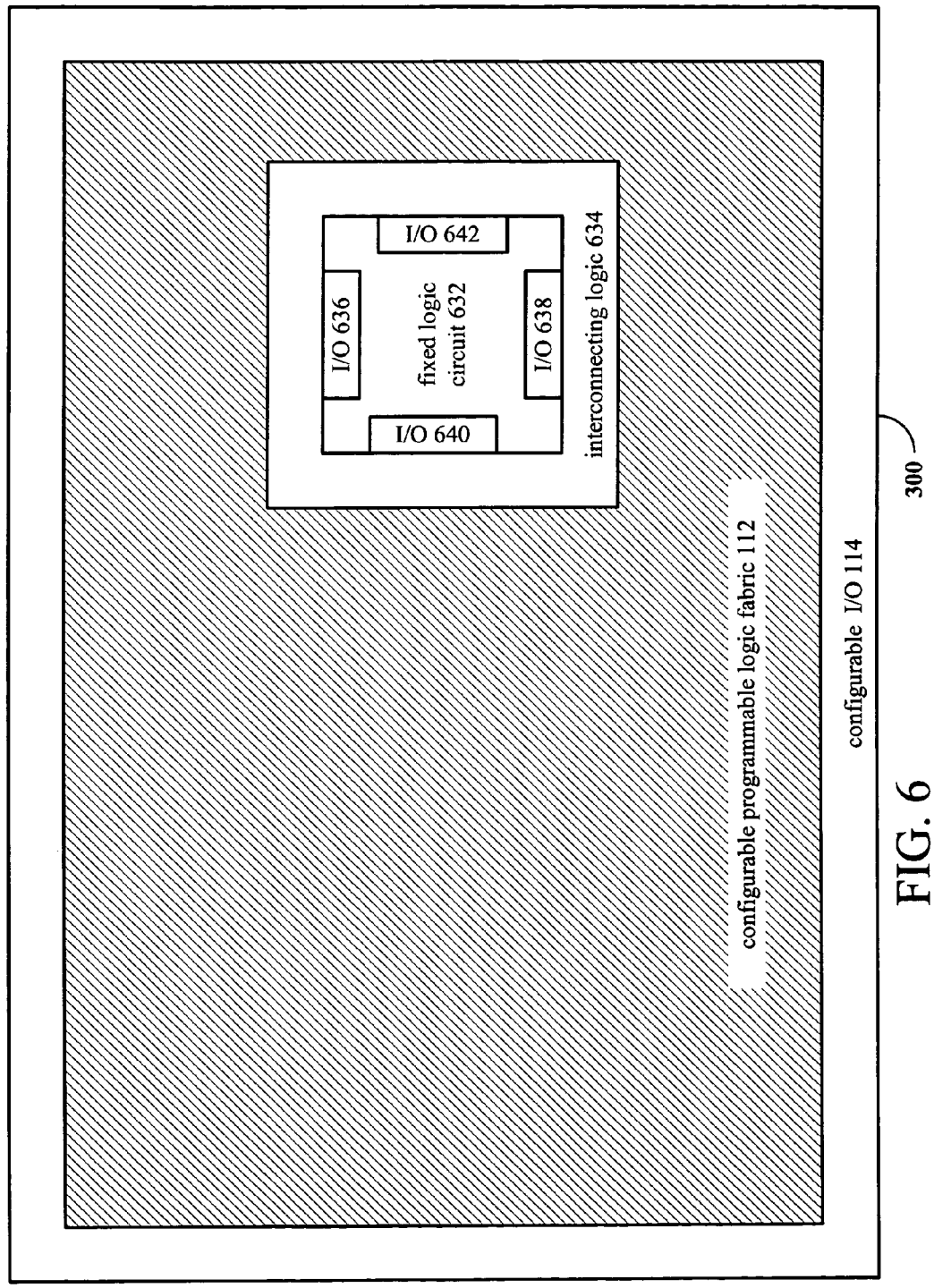
FIG. 6 illustrates a block diagram of a programmable gate array in accordance with the present invention.

The present invention can be more fully described with reference to FIGS. 6 through 33. FIG. 6 illustrates a block diagram of a field programmable gate array 300. The field programmable gate array 300 includes the configurable logic fabric 112, the configurable input/output blocks 114, a fixed logic circuit 632 and interconnecting logic 634. The fixed logic circuit 632 may be a digital signal processor, microprocessor, physical layer interface, link layer interface, network layer interface, audio processor, video graphics processor, logic circuitry, and/or applications-specific integrated circuits.

Typically, the fixed logic circuit 632 includes a plurality of inputs and a plurality of outputs, which are represented by input/output ports 636, 638, 640 and 642. The input/output ports 636–642 are operably coupled to the interconnecting logic 634, which provides connectivity between the input/output ports of the fixed logic circuit 632 with the configurable logic fabric 112 of the FPGA 300. It should be noted that more than one fixed logic circuit can be included in the programmable gate array.

The configurable logic fabric 112 includes a plurality of configurable logic blocks (CLBs) and programmable interconnects. The architecture of the configurable logic fabric may be row or column based, hierarchical-PLD, symmetrical array, and/or a sea-of-gates. The configurable logic blocks, interconnects, and I/O blocks may be, for example, of the type manufactured and distributed by Xilinx, Inc. The interconnects may include a plurality of switch matrix devices that utilize static RAM cell technology, anti-fuse cell technology, EPROM transistor technology, and/or EEPROM transistor technology.

The field programmable gate array 300 may be implemented as an integrated circuit wherein the configurable I/O blocks 114, configurable logic fabric 112, the interconnecting logic 634 and the fixed logic circuit 632 are fabricated on a substrate. In one embodiment, the circuitry of each of these elements 112, 114, 632 and 634, are implemented using CMOS technology on a silicon substrate. However, as one of average skill in the art will appreciate, other integrated circuit technologies and substrate compositions may be used.

In operation, the interconnecting logic 634 provides coupling between the configurable logic fabric 112 and the fixed logic circuit 632. As such, end users of the field programmable gate array 300 may program it by treating it as a component of the configurable logic fabric 112. For example, if the fixed logic circuit 632 includes a microprocessor, the interconnecting logic 634 may include memory for storing programming instructions and data in addition to connectivity to memory of the FPGA 300.

Accordingly, the configurable logic fabric 112 is configured to perform desired functions in combination with the fixed logic functions of the microprocessor. Thus, with an embedded microprocessor, the field programmable gate array 300 offers the flexibility of an FPGA, with the processing efficiency of an application-specific integrated circuit microprocessor. In addition, by embedding a microprocessor within the configurable logic fabric 112, as opposed to having two separate integrated circuits (one for the microprocessor and another for the FPGA), power consumption is reduced due to the elimination of interconnecting pins and traces between the two separate integrated circuits. Further, the field programmable gate array 300 requires less printed circuit board real estate than separate integrated circuits for an FPGA and a microprocessor.

Figure 7:
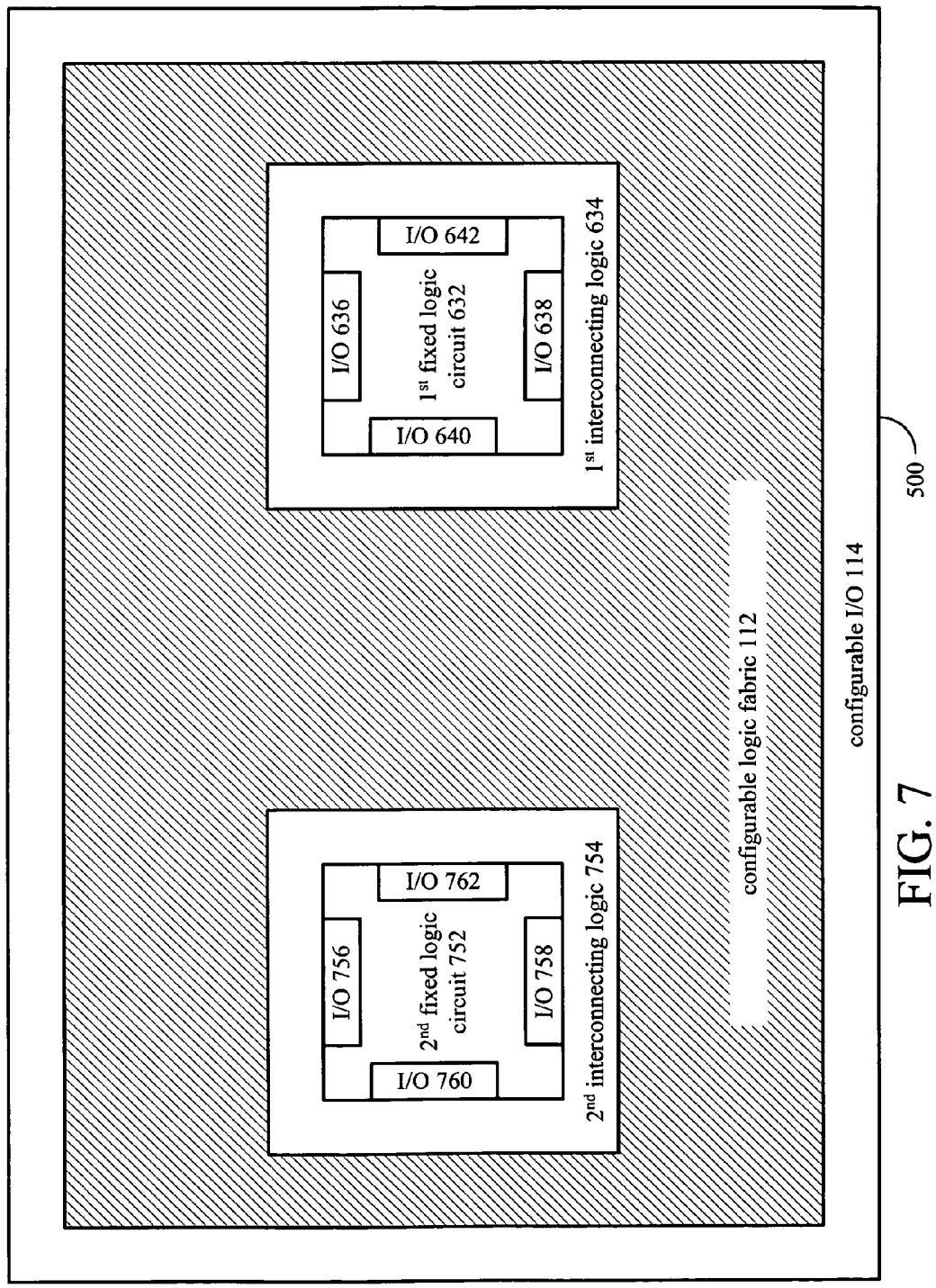
FIG. 7 illustrates a graphical diagram of an alternate programmable gate array in accordance with the present invention.

FIG. 7 illustrates a graphical diagram of an alternate field programmable gate array 500. The field programmable gate array 500 includes the configurable logic fabric 112, the configurable input/output blocks 114, a $1^{st}$ fixed logic circuit 632, $1^{st}$ interconnecting logic 634, a $2^{nd}$ fixed logic circuit 752 and $2^{nd}$ interconnecting logic 754. In this illustration, the $1^{st}$ interconnecting logic 634 and $1^{st}$ fixed logic circuit 632 are as generally described with reference to FIG. 6.

The $2^{nd}$ fixed logic circuit 752 may include any logic functions, including those of a digital signal processor, microprocessor, physical layer interface, link layer interface, network layer interface, audio processor, video graphics processor, logic circuitry, and/or an application-specific integrated circuit. The $2^{nd}$ fixed logic circuit 752 includes a plurality of input/output ports 756, 758, 760 and 762 that allow it to interface with the $2^{nd}$ interconnecting logic 754. The $2^{nd}$ interconnecting logic 754 provides the connectivity between the $2^{nd}$ fixed logic circuit 752 and the configurable logic fabric 112.

Figure 8:
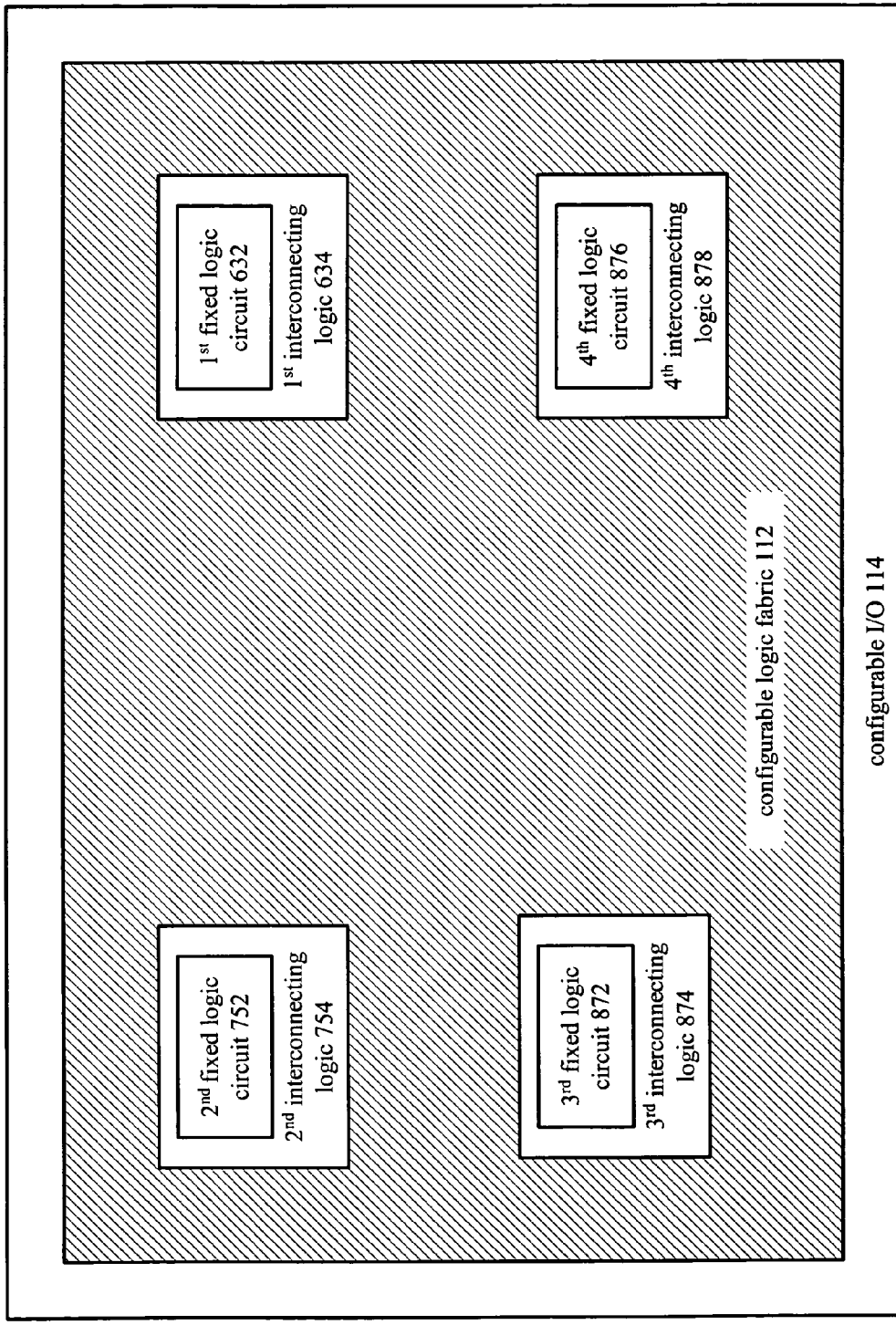
FIG. 8 illustrates a graphical diagram of another programmable gate array in accordance with the present invention.

FIG. 8 illustrates a graphical diagram of another field programmable gate array 700. The field programmable gate array 700 includes the configurable logic fabric 112, the configurable input/output blocks 114, and four fixed logic circuits 632, 752, 872 and 876. The structure of each fixed logic circuit is similar to the fixed logic circuit shown in FIG. 7 (note that the I/Os in each fixed logic circuit are not shown because of the limited size of the drawings). Each fixed logic circuit 632, 752, 872 and 876 has its own corresponding interconnecting logic 634, 754, 874 and 878, respectively. The interconnecting logic 634, 754, 874 and 878 provide its respective fixed logic circuit connectivity to the configurable logic fabric 112.

The construct of interconnecting logic 634, 754, 874 and 878 will be dependent upon the type of fixed logic circuit it is supporting. For instance, if the logic circuit is a fixed logic function, the interconnecting logic 634, 754, 874 and/or 878 would include interconnecting tiles in order to perform a particular Boolean function. The interconnecting tiles will be described in greater detail with reference to FIGS. 9, 10 and 12. If, however, the fixed logic circuit is more complex, such as a digital signal processor, microprocessor, physical layer interface, link layer interface, network layer interface, audio processor, video graphics processor, and/or applications-specific integrated circuit, the interconnecting logic 634, 754, 874 and/or 878 will include a plurality of interconnecting tiles and interfacing logic. The interfacing logic will be described in greater detail with reference to FIGS. 9 and 10.

Figure 9:
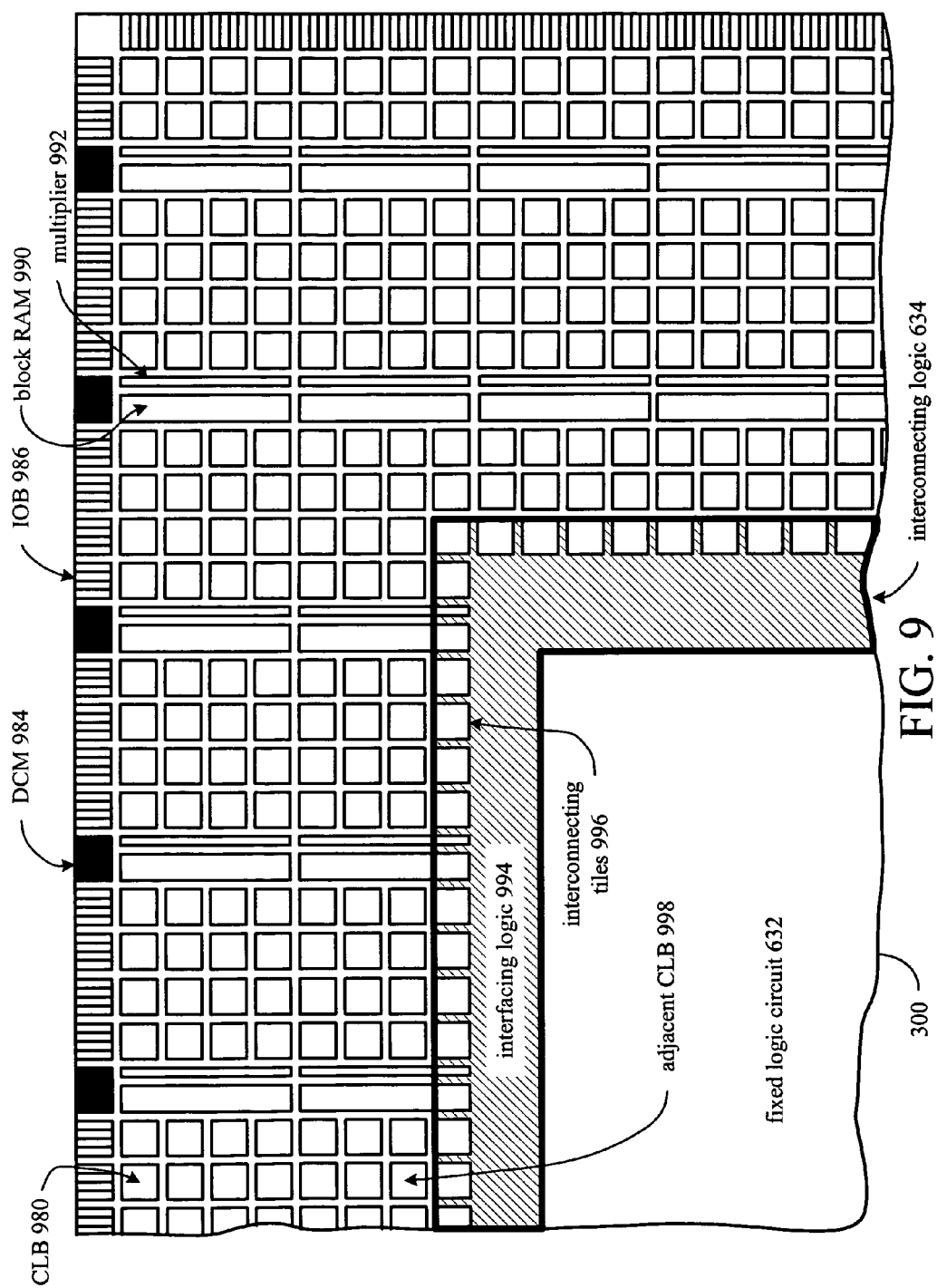
FIG. 9 illustrates a more detailed graphical diagram of a portion of the programmable gate array of an embedded device of FIG. 6.

FIG. 9 illustrates a more detailed graphical diagram of a portion of the field programmable gate array 300 with an embedded device of FIG. 6. While FIG. 9 is illustrated with reference to the FPGA 300 of FIG. 6, the concepts regarding the interconnecting logic 634 is equally applicable to the interconnecting logic 754 of FIG. 7, and the interconnecting logic 754, 874, and 878 of FIG. 8. As one of average skill in the art will appreciate, any number of fixed logic circuits may be embedded within the configurable logic fabric using interconnecting logic.

As shown in FIG. 9, the configurable logic fabric 112 includes a plurality of configurable logic blocks (CLBs) 980, a plurality of block random access memory (RAM) 990, and a plurality of multipliers 992. The configurable I/O block section 114 shown on FIG. 1 includes a plurality of individual I/O blocks (IOB) 986 and a plurality of digital clock managers (DCM) 984. The operations of the configurable logic blocks 980, the digital clock managers 984, the input/output blocks 986, the block RAM 990, and the multipliers 992 function in a similar manner as corresponding components found in the family of field programmable gate arrays designed and manufactured by Xilinx, Inc.

As shown, the configurable logic blocks 980, the block RAM 990 and the multipliers 992 are arranged in a series of rows and columns. The fixed logic circuit 632 displaces some of the components in programmable logic fabric 112. As such, the fixed logic circuit 632 and the interconnecting logic 634 replace a set of configurable logic blocks 980, a set of memory blocks 990, and/or a set of multipliers 992.

Figure 10:
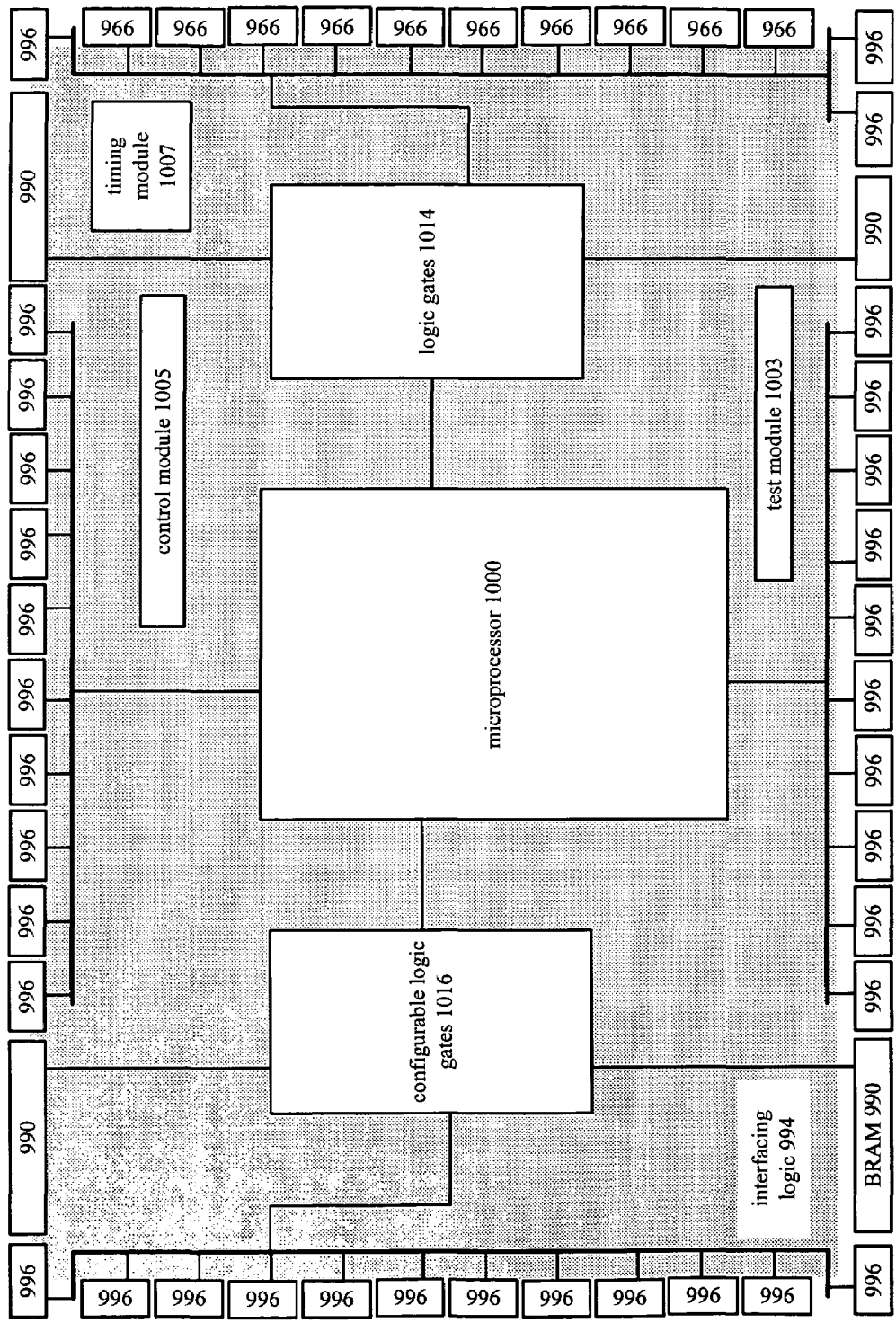
FIG. 10 illustrates a schematic block diagram of a microprocessor embedded in an FPGA in accordance with the present invention.

FIG. 10 illustrates a schematic block diagram of a microprocessor 1000 being embedded in the FPGA 300 as an example of a fixed logic circuit. It should be noted that the present invention is applicable to processors of any design, and is not limited to a particular type of processor. As one of average skill in the art will appreciate, the physical design of the microprocessor 1000 can have a variety of geometric configurations. The microprocessor 1000 is surrounded by the interconnecting logic 634 (shown in FIG. 9) that includes the interfacing logic 994 and a plurality of interconnecting tiles 996. The microprocessor 1000 may be connected to block RAMs 990 through memory controllers (not shown). The microprocessor 1000 may be directly connected to the block RAMs 990. By providing coupling between the microprocessor 1000 and the block RAMs 990, the block RAMs 990 may be shared by the microprocessor 1000 and the programmable logic fabric 112 of FIG. 1. Such direct sharing eliminates the need for programming the programmable logic fabric to provide the microprocessor with access to the block RAMs 990.

The interfacing logic 994 may contain one or more blocks of logic gates 1014. These blocks may be designed to perform any logic function, and may communicate in any manner with the microprocessor 1000, the block RAMs 990, and the interconnecting tiles 996. In FIG. 10, only one such block of logic functions is shown. The interfacing logic 994 may also contain one or more blocks of configurable logic gates 1016. These blocks may be configured to perform any logic function, and may communicate in any manner with the microprocessor 1000, the block RAMs 990, and the interconnecting tiles 996. In FIG. 10, only one such block of configurable logic functions is shown. The interfacing logic 994 may further contain a test module 1003 that controls the manufacturing testing of the microprocessor 1000, interconnecting tiles 996, and/or various parts of the interfacing logic 994. In FIG. 10, even though the test module 1003 is shown as an isolated block to simplify the diagram, in reality it would be connected to some or all of the above-mentioned components. A control module 1005 can be used to control the operations of the microprocessor 1000 and various components in the interfacing logic 994. The interfacing logic 994 may also contain a timing module 1007 that generates various timing signals for the microprocessor 1000 and other components in the interfacing logic 994. The timing module 1007 may contain clock generation circuits (such as oscillators), or may use some of the clock signals of the programmable logic fabric. In FIG. 10, even though the control module 1005 and timing module 1007 are shown as isolated blocks, they are in reality connected to some or all of the above-mentioned components. In addition, modules performing other functions may also be included.

The microprocessor 1000 may communicate directly with the interconnecting tiles 996 (which are programmably connected to the CLBs 980 shown in FIG. 9). The microprocessor 1000 may also communicate with the interconnecting tiles 996 through the blocks of logic gates 1014 and blocks of configurable logic gates 1016. The connections shown in FIG. 10 could be unidirectional and/or bidirectional.

The block RAMs 990 may store at least a portion of the executable instruction code for the microprocessor 1000. In addition, such memory may store the data to be processed by the microprocessor 1000 and the data already processed by the microprocessor 1000. Because the memory is shared between the microprocessor 1000 and the programmable logic fabric 112, configured portions of the programmable logic fabric 112 may retrieve the data to be processed and/or the data already processed to perform a certain function upon the data. It should be noted that the block RAMs 990 may be at any position relative to the microprocessor 1000 (top, down, left or right).

Figure 11:
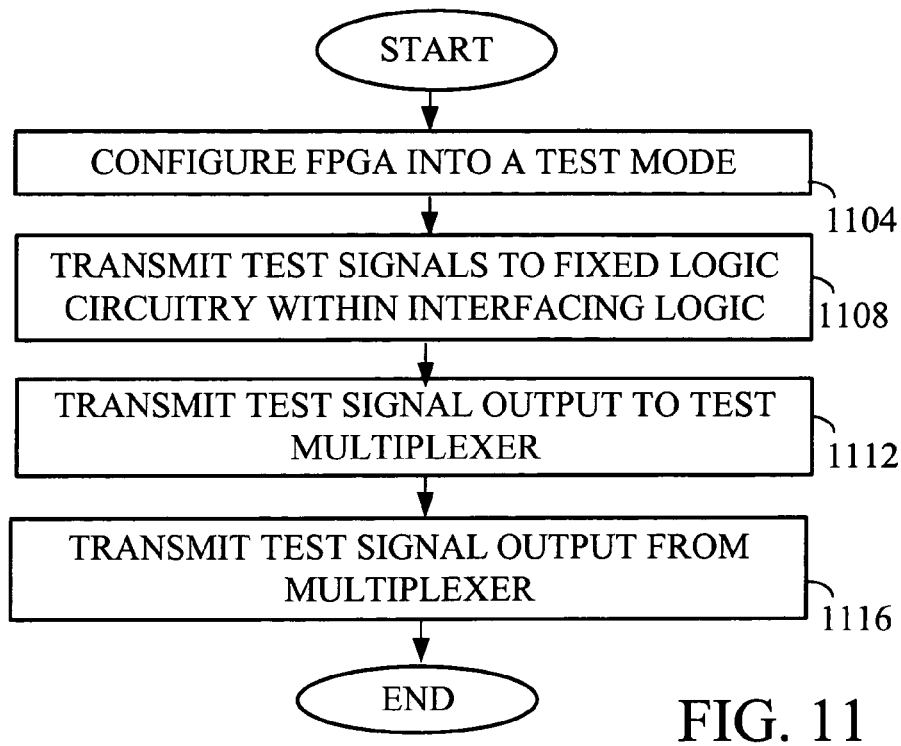
FIG. 11 is a flow chart illustrating a method for testing fixed logic circuitry within the interfacing logic according to one embodiment of the present invention.

FIG. 11 is a flow chart illustrating a method for testing fixed logic circuitry within the interfacing logic according to one embodiment of the present invention. Generally, the methods relating to performing test includes utilizing the inventive structure described herein. More specifically, the method includes configuring the FPGA into a test mode (step 1104). Thereafter, test signals are transmitted to the fixed logic circuitry within the interfacing logic from the FPGA fabric (whether generated there or externally (step 1108). Thereafter, test signal outputs from the fixed logic circuitry are transmitted to a test multiplexer (step 1112). The test signal outputs are then transmitted from the multiplexer through the fixed interfacing logic to the FPGA fabric (step 1116). In one embodiment of the invention, the FPGA fabric is configured to analyze the test signal outputs received from the multiplexer to determine whether the fixed logic circuitry passed or failed the test. In another embodiment of the invention, the test signal outputs are merely conducted through the FPGA fabric to an external device, or system, such as a tester, to determine pass or fail.

Figure 12:
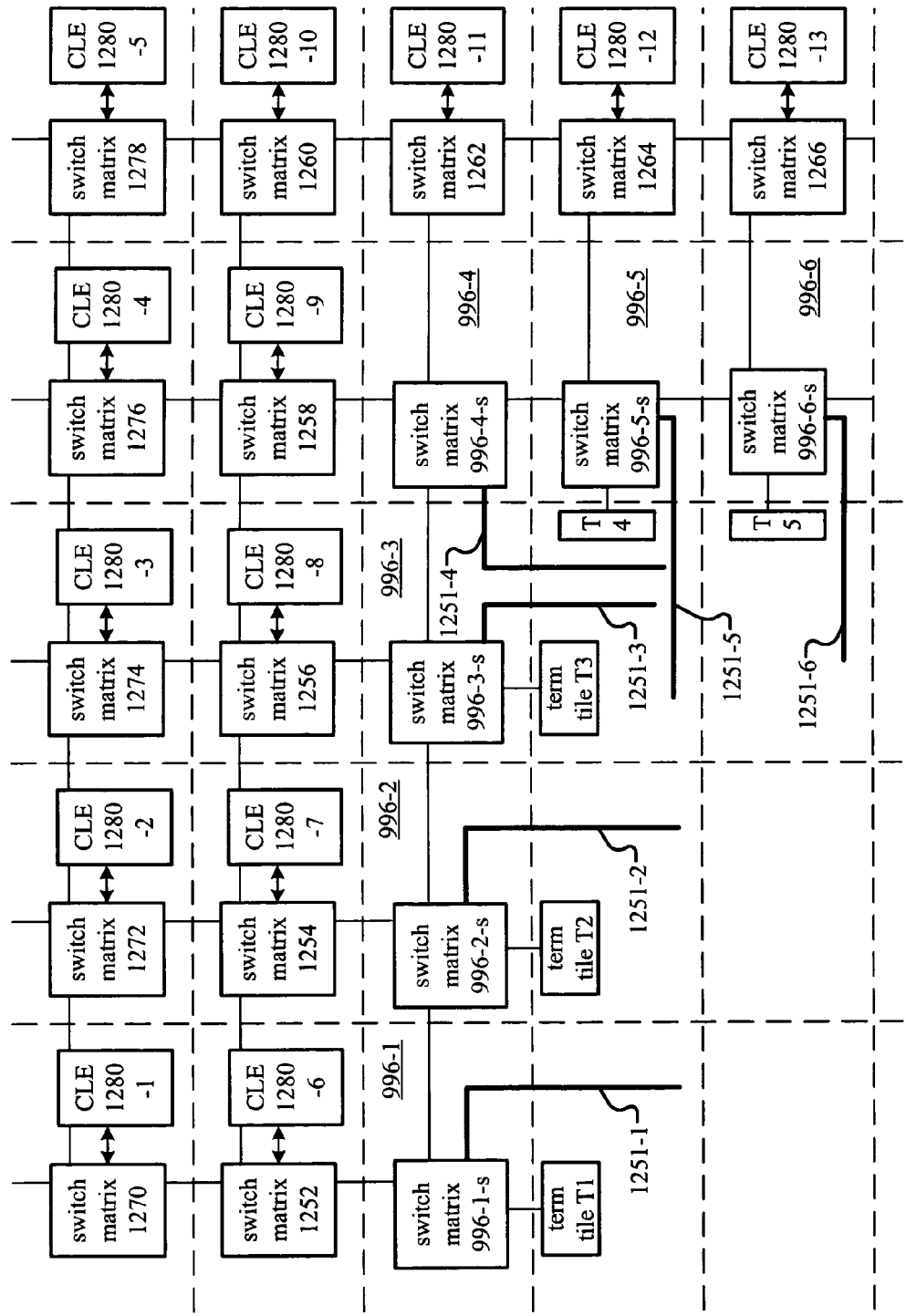
FIG. 12 illustrates a schematic block diagram of a few of the interconnecting tiles operably coupled to the surrounding programmable logic fabric.

FIG. 12 illustrates a schematic block diagram of a few of the interconnecting tiles 996-1 through 996-6 operably coupling to the surrounding programmable logic fabric. The surrounding programmable logic fabric includes a plurality of configurable logic elements (CLE) 1280-1 through 1280-13 and corresponding programmable switch matrices 1252 through 1278. Solid lines between the programmable switch matrices represent various interconnect lines that provide connectivity in the programmable logic fabric. An example of an FPGA architecture that can be used in the present invention can be found in U.S. Pat. No. 5,914,616 entitled, "FPGA Repeatable Interconnect Structure with Hierarchical Interconnect Lines."

Each interconnecting tile 996 contains a programmable switch matrix that is programmably connected to (a) a programmable switch matrix in the programmable logic fabric, (b) a termination tile (called herein "term tile"), and (c) adjacent interconnecting tiles. FIG. 12 shows six switch matrices labeled 996-1-s to 996-6-s in the interconnecting tiles 996-1 to 996-6, respectively. As an example, the switch matrix 996-2-s is connected to the switch matrix 1254 in the programmable logic fabric, a term tile T2, and adjacent switch matrices 996-1-s and 996-3-s. Similarly, the switch matrix 996-5-s is connected to the switch matrix 1264 in the programmable logic fabric, a term tile T4, and adjacent switch matrices 996-4-s and 996-6-s. The six programmable switch matrices 996-1-s to 996-6-s each contains a plurality of connections (shown as lines 1251-1 to 1251-6, respectively) that are connected to the microprocessor 1000 and/or components in the interfacing logic 994.

The structure of switch matrices 996-1-s to 996-6-s is substantially the same as that of the switch matrices in the programmable logic fabric.

The function of the term tiles is to terminate the interconnect lines and/or provide connectivity to the lines that are interrupted by the microprocessor 1000 and/or components of the interfacing logic 994. In one embodiment (e.g., the FPGA described in the above mentioned U.S. Pat. No. 5,914,616), the programmable logic fabric contains single, hex and long lines. In the term tiles, the single lines are U-turned to other single lines, the hex lines are rebuffered and span to the far side of the microprocessor 1000, and the long lines span the microprocessor 1000.

Figure 13:
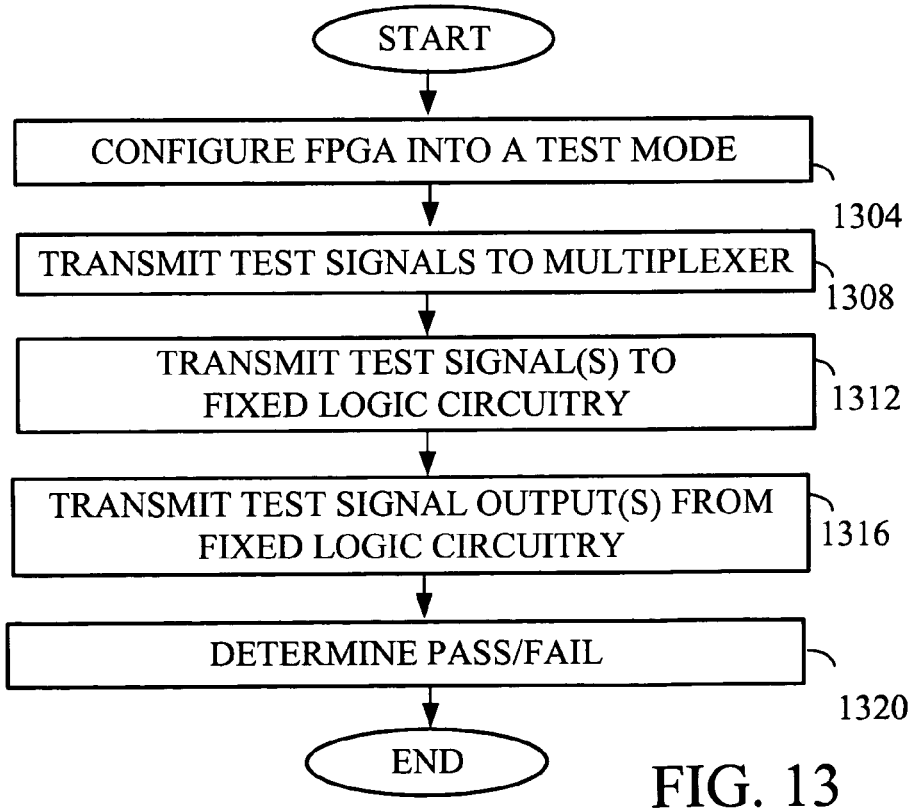
FIG. 13 is a flow chart illustrating a method for testing fixed logic circuitry within the interfacing logic according to one embodiment of the present invention.

FIG. 13 is a flow chart illustrating a method for testing fixed logic circuitry within the interfacing logic according to one embodiment of the present invention. Generally the method includes configuring the FPGA into a test mode (step 1304). Thereafter, test signals are transmitted to a test multiplexer within the interfacing logic (step 1308). The test signals are then transmitted from the test multiplexer to fixed logic circuitry (either an embedded device or fixed logic formed within the gasket or interfacing circuitry (step 1312). The test signal outputs from the fixed logic circuitry are then transmitted through a communication path formed within the gasket (interfacing logic) to the FPGA fabric (step 1316). In one embodiment of the invention, the FPGA fabric is configured to analyze the test signal outputs to determine whether the embedded core device passed or failed the test. In another embodiment of the invention, the test signal outputs are merely conducted through the FPGA fabric to an external device, or system, such as a tester, to determine pass or fail.

Figure 14:
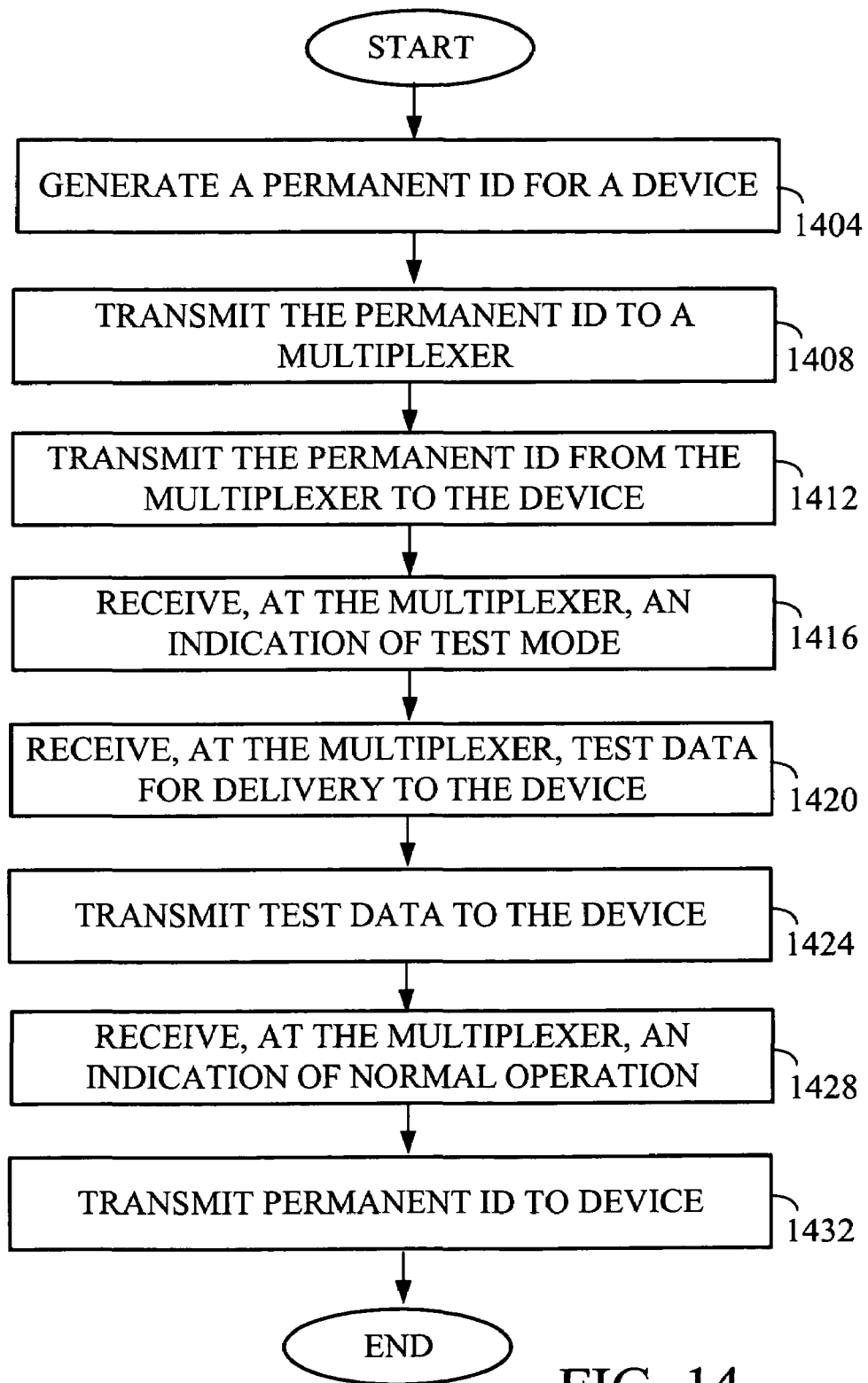
FIG. 14 is a flow chart illustrating a method for assigning a permanent ID to a device according to one aspect of the present invention.

FIG. 14 is a flow chart illustrating a method for assigning a permanent ID to a device according to one aspect of the present invention. As discussed previously, it is advantageous to have a system in which inputs for receiving a device ID may be stimulated during test procedures. Typically, however, approaches that facilitate this capability store the device ID in memory. Through any one of a plurality of situations, however, an ID may be overwritten with an older and presently invalid ID. Accordingly, the safest solution heretofore has been to not provide the desirable capability of stimulating the inputs for receiving the permanent ID. The invention illustrated in FIG. 14 provides a way of stimulating ID inputs during testing without using a scheme in which the device ID is stored in memory and can be overwritten.

More specifically, the invention includes a plurality of steps, the first of which is to generate a permanent ID for a device (step 1404). Typically, such an ID is defined by logic or hardware of the FPGA. The ID is then transmitted to a multiplexer (step 1408). Then, under non-test conditions, the ID is transmitted to a device to enable it to know its own ID while it is operating (step 1412).

In test mode, however, the multiplexer receives an indication that it is in test mode (step 1416). With this indication, the multiplexer changes the coupling to decouple the device from the hardware that defines the device ID (the FPGA in the described embodiment of the invention). The device is then coupled to a test signal generation source. The test signal generation source may be one of many different devices, including, for example, logic within the FPGA, fixed logic circuitry formed within the FPGA or an external tester.

Thus, once the multiplexer has performed it's switching, it then receives test data for delivery to the inputs of the device that normally receive the permanent device ID (step 1420). The test data is transmitted from the multiplexer to the device (step 1424). Once testing is complete, the multiplexer receives an indication of Normal operation (step 1428) and switches the connections back to the original configuration and resumes transmitting the permanent device ID to the device (step 1432).

Figure 15:
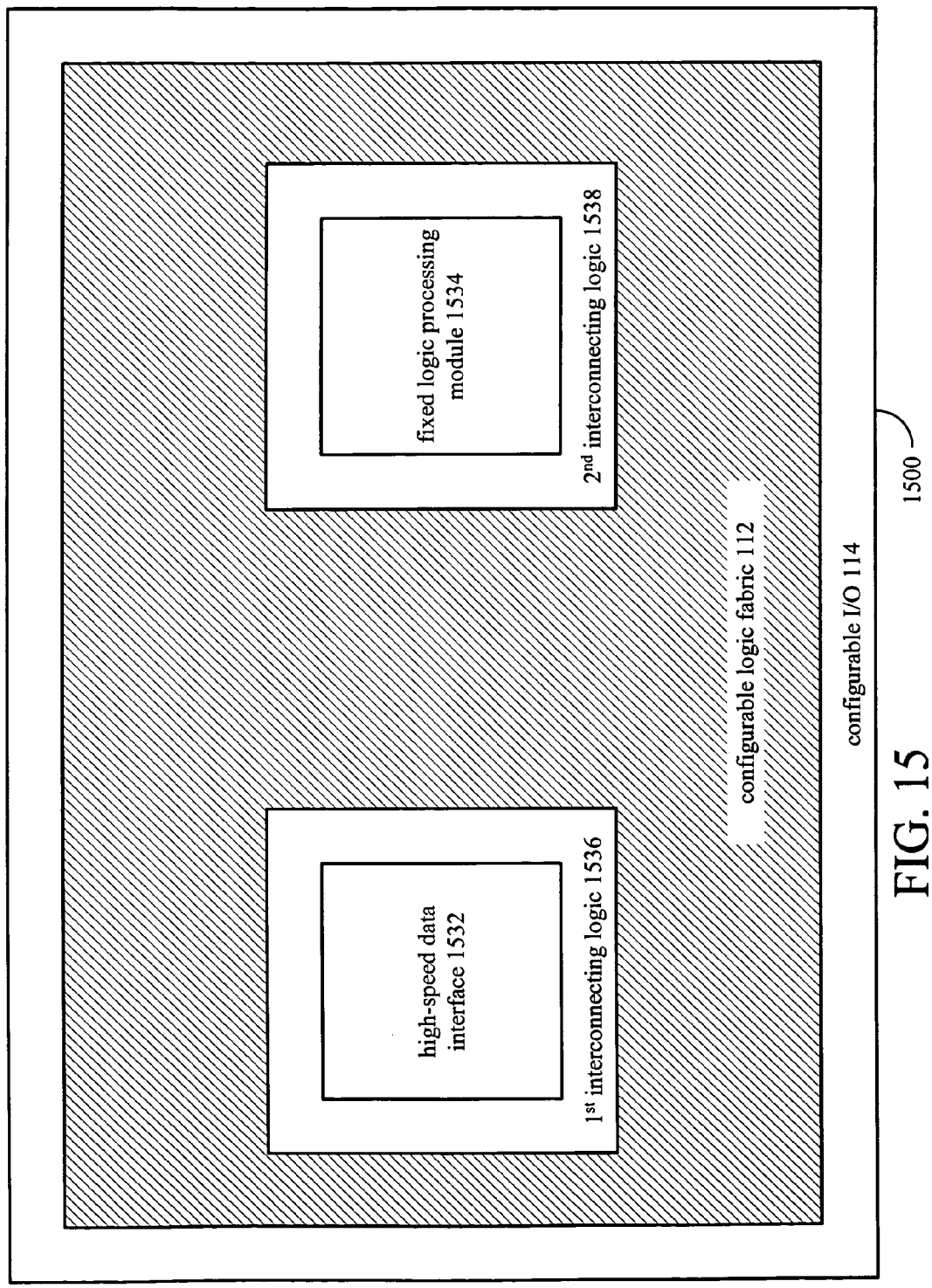
FIG. 15 illustrates a functional diagram of yet another programmable gate array in accordance with the present invention.
Figure 16:
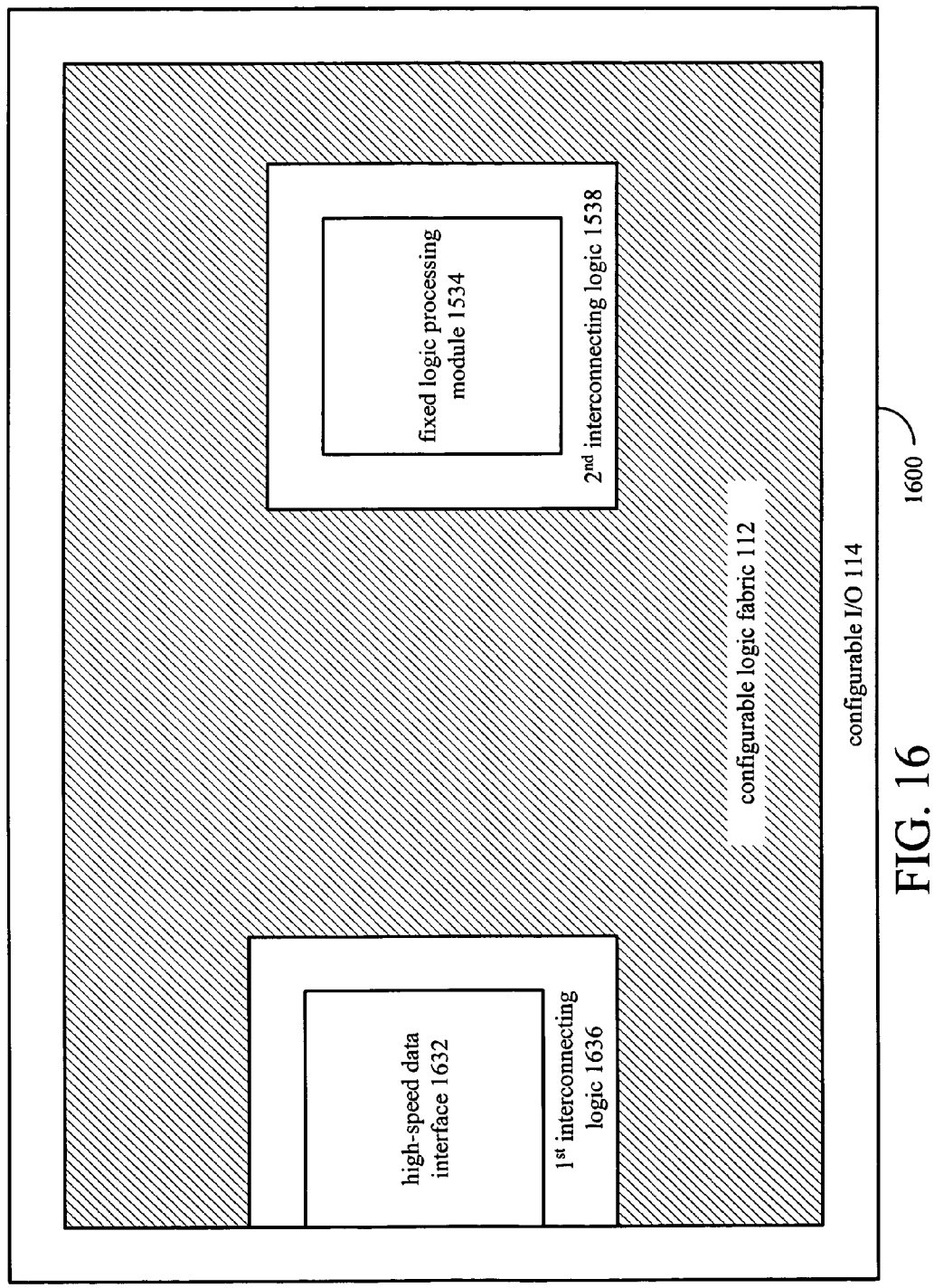
FIG. 16 illustrates a functional diagram of a variation of the programmable gate array of FIG. 15.
Figure 17:
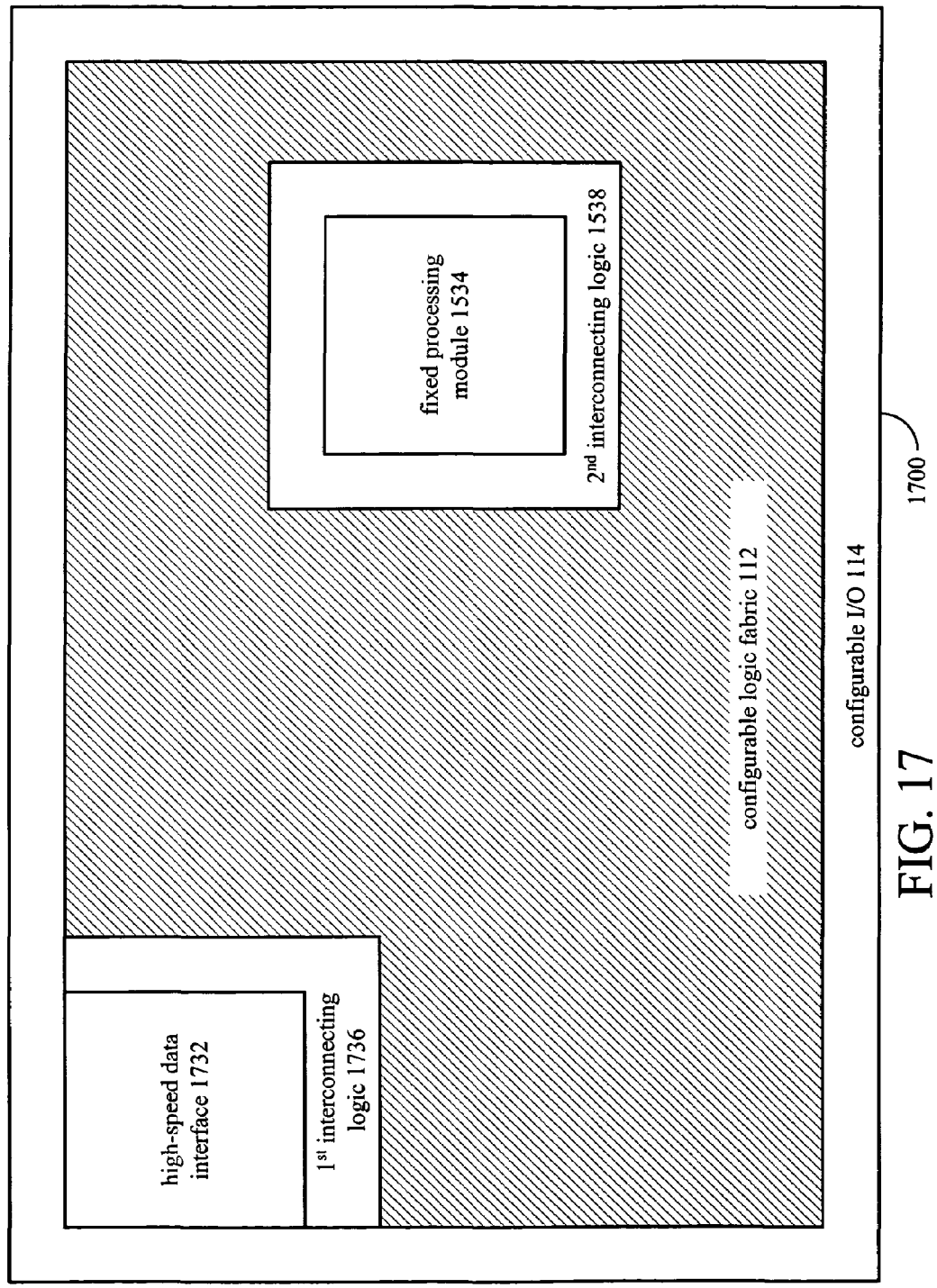
FIG. 17 illustrates a functional diagram of a further variation of the programmable gate array of FIG. 15.

FIGS. 15, 16 and 17 are functional schematic diagrams illustrating a plurality of arrangements of a fixed logic device formed or "cut into" a configurable logic fabric in which the embedded device includes interconnecting logic between it and the configurable logic fabric according to various embodiments of the present invention. As may be seen in FIG. 15, a high speed data interface 1532 is surrounded by a $1^{st}$ interconnecting logic 1536 while a fixed logic processing module 1534 is surrounded by a $2^{nd}$ interconnecting logic 1538. FIG. 16 is similar to FIG. 15 with the exception that the high-speed data interface 1632 is placed at the edge of the configurable logic fabric. Accordingly, the $1^{st}$ interconnecting logic 1636 is only formed to surround the high-speed data interface 1632 on those sides that are bound by the configurable logic fabric. FIG. 17 is similar to FIG. 16 with the exception that the high-speed data interface is placed within a corner of the configurable logic fabric 112. Accordingly, the $1^{st}$ interconnecting logic 1736 is formed on only two sides of the high-speed data interface 1732.

Figure 18:
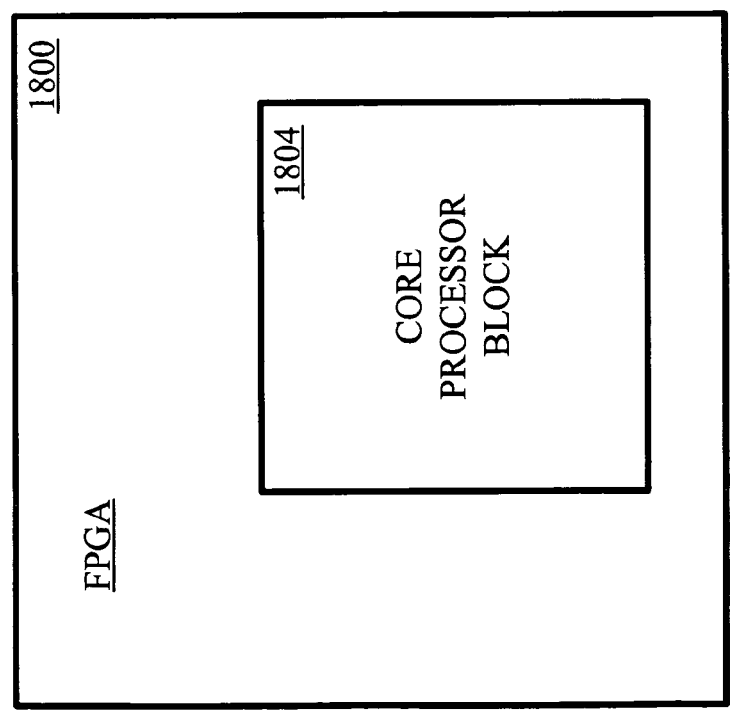
FIG. 18 is a functional block diagram illustrating an FPGA formed according to one embodiment of the present invention.

FIG. 18 is a functional block diagram illustrating an FPGA formed according to one embodiment of the present invention. The FPGA 1800 includes a fixed logic core processor block 1804 that is embedded within the FPGA fabric. In the illustrated embodiment, the fixed logic core processor block 1804 includes a microprocessor, e.g., Power PC 405, or another type of fixed logic device as was previously described herein. The fixed logic core processor block 1804 is fabricated so that a programmable FPGA fabric 1800 surrounds it. The FPGA fabric includes CLBs, block RAM, interconnections, etc. With this construction of the fixed logic core processor block 1804, no direct coupling exists between the input/output of the FPGA 1800 and the fixed logic core processor block in the embodiment shown. All external coupling to the fixed logic core 1804 must traverse the FPGA fabric.

Figure 19:
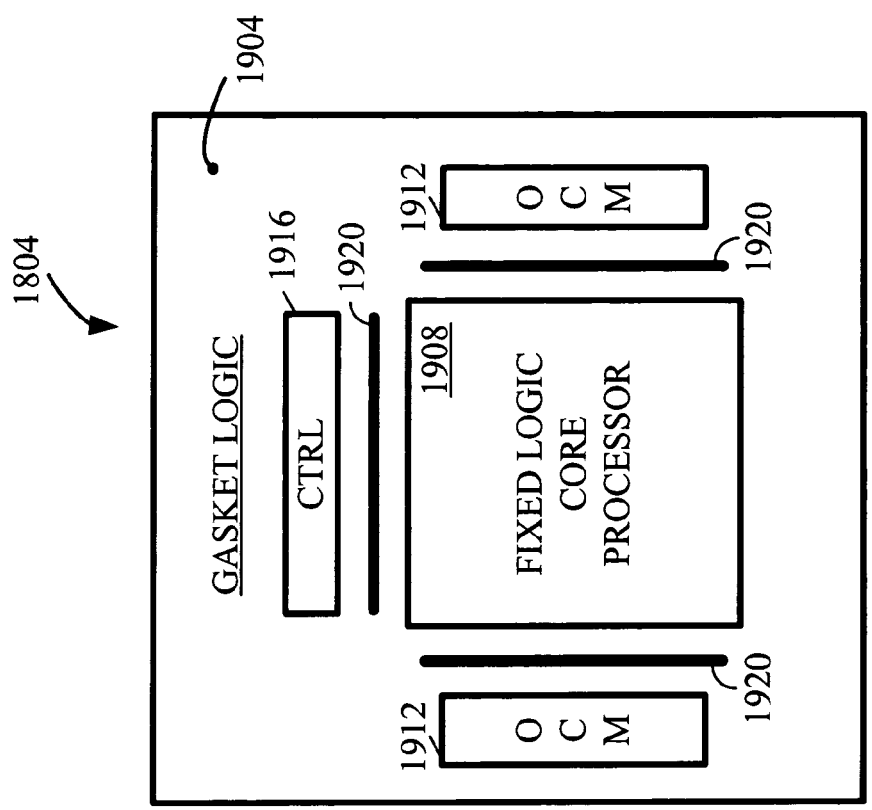
FIG. 19 is a block diagram generally illustrating the components of a fixed logic core processor block that is embedded within an FPGA fabric according to the present invention.

FIG. 19 is a block diagram generally illustrating the components of the fixed logic core processor block 1804 of FIG. 18. The core processor block 1804 includes gasket logic 1904 and fixed logic core processor 1908. Gasket logic 1904 interfaces the fixed logic core processor 1908 with the FPGA fabric within which it is embedded. The gasket logic 1904 includes a pair of On Chip Memory controller modules (OCMs) 1912, a controller 1916, and additional logic.

The OCMs 1912 interface the fixed logic core processor 1908 with block RAM of the FPGA fabric. The controller 1916 is accessible by the FPGA fabric to allow the FPGA fabric to control the gasket logic 1904 and the fixed logic core processor 1908. The gasket logic 1904 is fixed logic circuitry wherein its primary function is to interface the fixed logic core processor 1908 with the FPGA fabric. Many aspects of the FPGA fabric have already been described herein with reference to FIGS. 6–17.

Continuing to refer to FIG. 19, the gasket logic also includes a plurality of multiplexer arrays 1920 that multiplex data, address, and control lines between fixed logic core processor 1908, OCMs 1912, and controller 1916. These multiplexer arrays 1920 also serve to: (1) isolate the fixed logic core processor 1908 from the gasket logic 1904 during testing of the fixed logic core processor 1908 and (2) isolate the gasket logic from the fixed logic core processor 1908 from the gasket logic 1904 during testing of the gasket logic

1904. As will be further described herein, during testing of the fixed logic core processor 1908 and gasket logic 1904, the FPGA fabric and the multiplexer arrays 1920 will be operated to apply scan vectors and other test inputs to the fixed logic core processor 1908 and to the gasket logic 1904.

Figure 20:
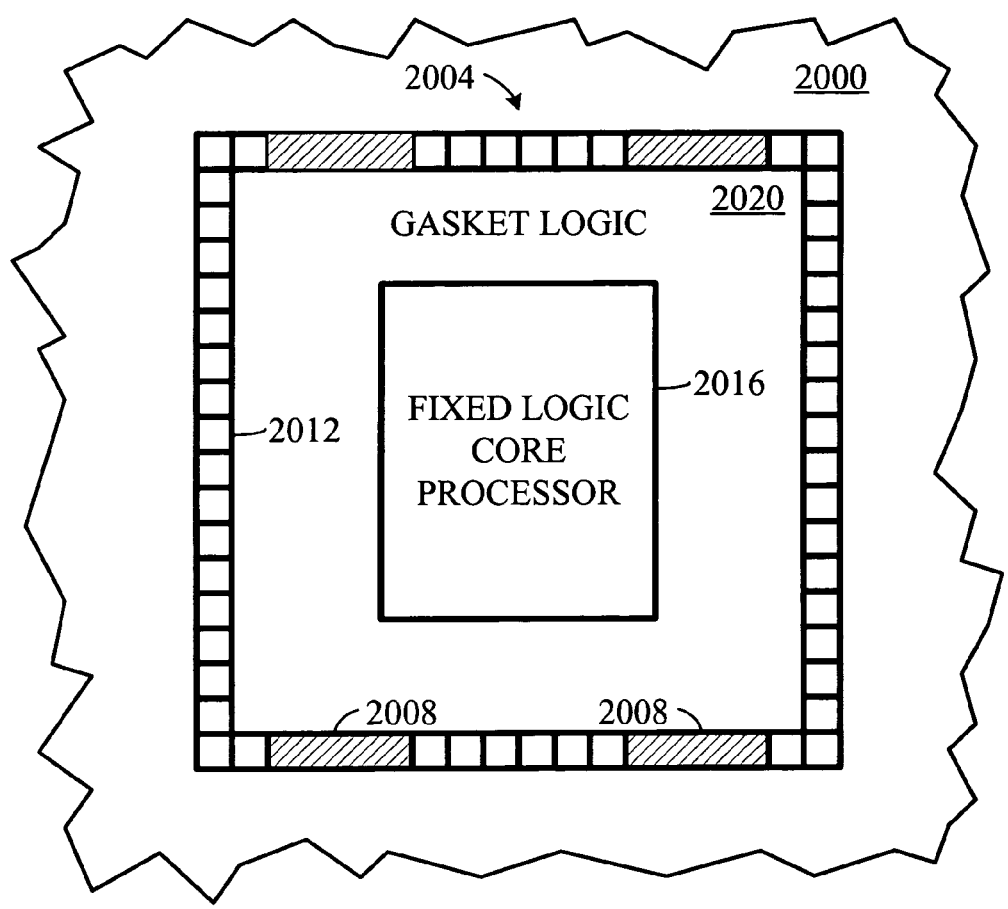
FIG. 20 is a functional block diagram illustrating the connectivity between various FPGA and fixed logic core processor blocks constructed according to the present invention.

FIG. 20 is a functional block diagram illustrating the functional connectivity between various FPGA and fixed logic core processor blocks according to one described embodiment of the present invention. The components are laid out in a functional manner to illustrate how they may be coupled for testing purposes. An FPGA gasket 2004 is formed within the FPGA 2000 and includes interfacing circuitry 2012 and Block RAM 2008.

During testing of the fixed logic core processor 2016 (an embedded device; for example, a Power PC), the FPGA fabric 2000 is configured to access, stimulate, and receive outputs from the fixed logic core processor 2016. Likewise, during testing of the gasket logic 2020, the FPGA fabric 2000 is configured to access, stimulate, and receive output from the gasket logic 2020.

More particularly, during testing of the fixed logic core processor 2016, the FPGA fabric 2000 is configured to provide access to scan chains of the fixed logic core processor 2016, scan in test vectors to the fixed logic core processor 2016, and scan out results from the fixed logic core processor 2016. Further, during the testing of the fixed logic core processor 2016, the FPGA fabric 2000 is configured to stimulate the input of the fixed logic core processor 2016 and to receive outputs produced by the fixed logic core processor 2016. The manner in which fixed logic core processors 2016 are tested using a test socket and a coupled tester is generally known. However, use of the FPGA fabric 2000 and multiplexers 1920 (of FIG. 19) to test the fixed logic core processor 2016 is unique to the present invention.

Figure 21:
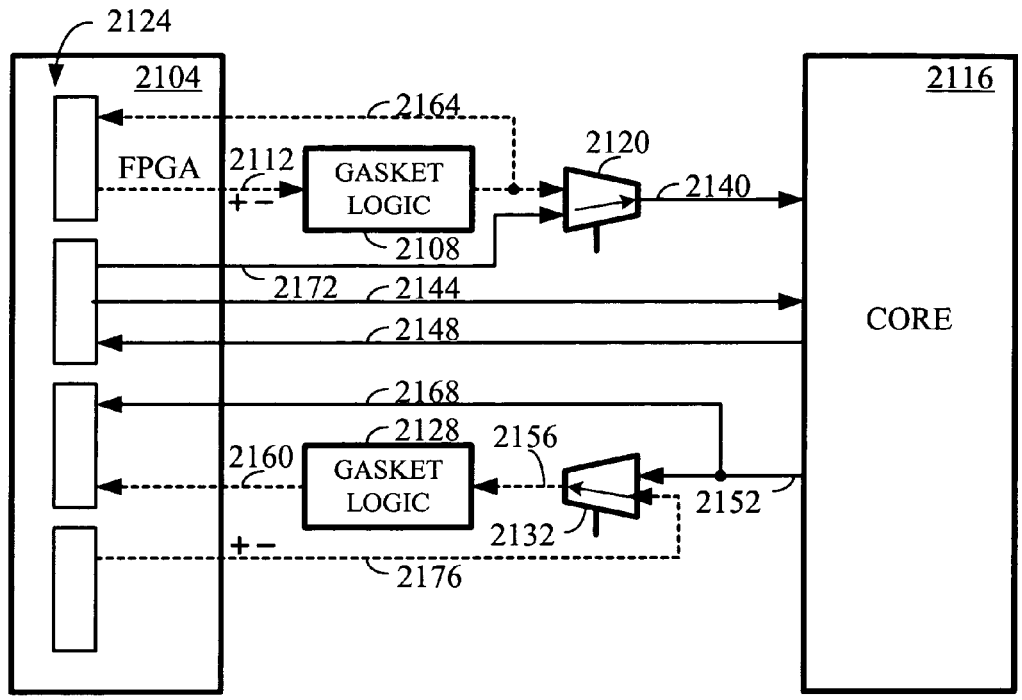
FIGS. 21 and 22 are functional block diagrams illustrating functional blocks of an FPGA having an embedded fixed logic core, gasket logic, and test circuitry, selectively configurable according to different test modes of operation.
Figure 22:
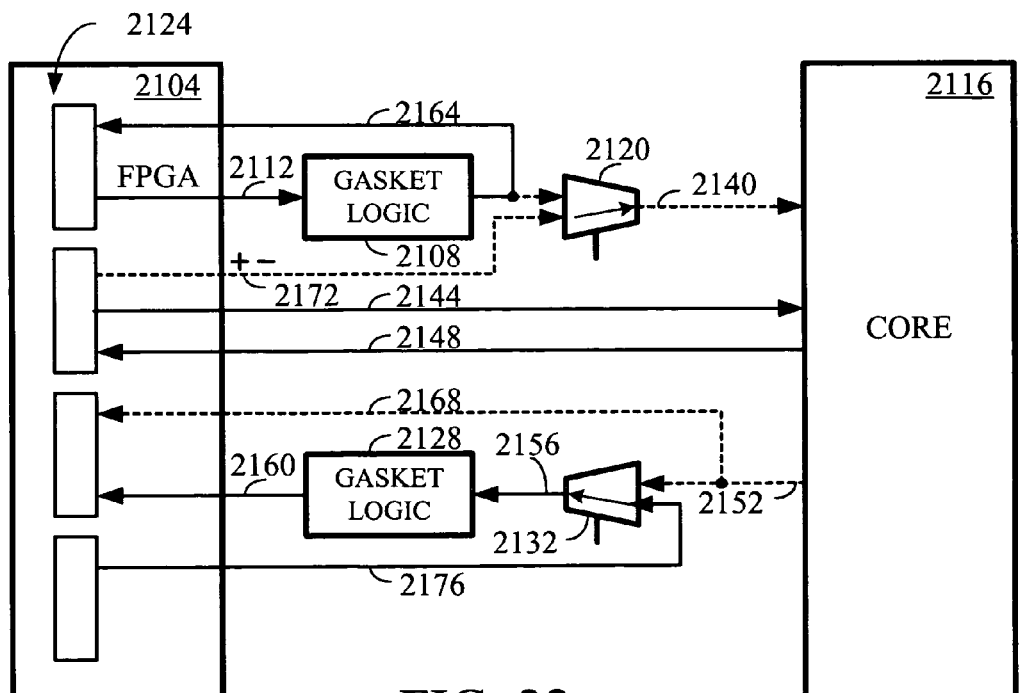

FIGS. 21 and 22 are functional block diagrams illustrating functional blocks of an FPGA having an embedded fixed logic core processor, gasket logic, and test circuitry, selectively configurable according to different test modes of operation. During testing of the fixed logic core processor 2116, FPGA fabric 2104 is configured according to the test mode of operation (gasket test or embedded core device test). Test circuitry formed within FPGA 2104 comprises logic circuitry that is configured for test whenever the FPGA is in a test mode of operation and is constructed using known FPGA design and fabrication techniques. In one embodiment of the invention, the logic circuitry of FPGA 2104 comprises a configuration for operation in a first test mode in which portions of the gasket logic 2108 and 2128 are tested and a second configuration for operation in a second test mode in which the embedded fixed logic core device is tested.

The logic portions are shown in FIGS. 21 and 22 as a plurality of modules shown generally at 2124. These modules 2124 provide inputs to the fixed logic core processor 2116, receive outputs from the fixed logic core processor 2116, and support the interface of the FPGA (fabric, fixed processing core, gasket logic, etc.) with a tester via FPGA input/output pins. Thus, these modules 2124 emulate a portion of the testing functions that would otherwise be implemented by the tester. These testing functions allow the fixed processing core 2116 to be tested as if all of its input/output and control pins were externally accessible.

FIG. 21 also illustrates the configuration of the test circuitry while testing an embedded fixed logic core processor. In reference to FIGS. 21 and 22, steady state signals are indicated with the symbol "+−". Additionally, dashed lines represent communication lines that are not carrying test data.

During testing of the embedded fixed logic core processor 2116, the FPGA fabric 2104, while configured in a test mode of operation, uses data path 2172 to access the inputs of fixed logic core processor 2116 and uses path 2168 to observe the outputs of the fixed logic core processor 2116. The data paths 2172 and 2168 are a plurality of bits wide, the width of these data paths depending upon the number of inputs and outputs of the fixed logic core processor 2116.

Multiplexer 2120 allows the FPGA fabric 2104 to directly access the fixed logic core processor inputs 2140. FPGA 2104, when configured in a test mode for testing an embedded core device, activates the multiplexer 2120 to couple data path 2172 to inputs of core 2116. Further, the FPGA fabric 2104 observes the outputs 2152 of the fixed logic core processor 2116 via data path 2168. During testing of the embedded fixed logic core processor 2116, the FPGA fabric 2104 also may provide additional inputs via data paths 2144 and observe additional outputs via data path 2148.

While the test circuitry is configured to test the fixed logic core processor 2116, multiplexer 2132 is controlled to prevent the gasket logic 2128 from receiving the outputs on communication path 2152 from the fixed processor core 2116. In such case, the application of steady state input signals by the FPGA fabric 2104 via data path 2176 hold the gasket logic 2128 in a known state. Similarly, the FPGA fabric 2104 may hold the gasket logic 2108 in a known state via application of steady state input data signals via data path 2112.

FIG. 22 illustrates the configuration of the test circuitry while testing the gasket logic 2108 and 2128. During testing of the gasket logic 2108, the FPGA fabric 2104 uses data path 2112 to apply test signals to the gasket logic 2108 and uses data path 2164 to observe the output of gasket logic 2108. These data paths 2112 and 2164 are a plurality of bits wide, the width of these data paths depending upon the number of inputs and outputs of the gasket logic 2108. While the test circuitry is configured to test the gasket logic 2108, multiplexer 2120 may be controlled to apply a known state to the fixed processor core 2116. In such case, the application of steady state input data by the FPGA fabric 2104 via data path 2172 and 2140 would hold the fixed processor core 2116 in a fixed state.

Further, while testing the gasket logic 2128, multiplexer 2132 allows the FPGA fabric 2104 to directly access the inputs 2156 of the gasket logic 2128 via data path 2176. The FPGA fabric 2104 observes, therefore, the outputs 2160 of the gasket logic 2128 directly. Gasket logic 2128 receives test input signals on path 2156 that are generated by FPGA 2104 onto path 2176 through multiplexer 2132. As is understood, multiplexer 2132 couples path 2176 to path 2156 responsive to a control signal generated by FPGA fabric portion 2104. For simplicity, the control signals for the multiplexers are not shown herein.

Figure 23:
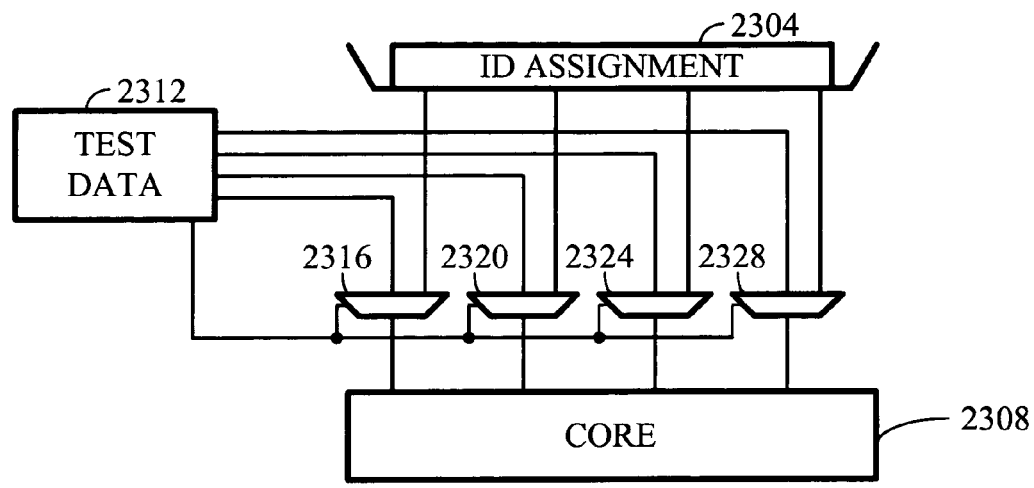
FIG. 23 is a functional block diagram illustrating a circuit configuration that supports selective ID Assignment according to one embodiment of the present invention.

FIG. 23 is a functional block diagram illustrating a circuit configuration that supports selective ID Assignment according to one embodiment of the present invention. An FPGA or other logic circuit is formed to generate an assigned ID that is used for transmission to a core device. Herein, an ID Assignment module 2304 generates a permanently stored ID to core device 2308. Often, for test purposes, it is desirable to transmit test signals in place of the core ID to the core during testing. One approach is to store an ID value in a non-permanent manner in volatile memory within an ID Assignment module. The transmission of the ID, therefore, may be driven by software and may be replaced by test signals during the test modes of operation.

One problem with this approach, however, is that voltage surges and other similar events can corrupt the ID values stored in the volatile memory. Accordingly, if an ID is impressed upon any type of ordinarily non-volatile memory to avoid undesired loss of the most current device ID, then test signals cannot be applied to the core device at the inputs that usually received the device ID.

FIG. 23 illustrates a solution to the aforementioned problem. A test data generator 2312 is coupled to the input side of a plurality of multiplexer units 2316–2328. More specifically, the test data generator typically includes at least one line that is coupled to each multiplexer 2316–2328 for producing test data thereto. Another input of each multiplexer 2316–2328 is coupled to receive a data line that is used for carrying an ID portion. The ID portion is stored within non-volatile memory of ID Assignment module 2304. Thus, there is one multiplexer unit for each data line that is used for carrying an ID portion. Accordingly, the default setting of the multiplexers 2316–2328 couples the ID Assignment module 2304 to the Core 2308 to facilitate delivery of its device ID.

During test, however, test data generator 2312 also is coupled to produce control signals to multiplexers 2316–2328 to prompt them to decouple the ID Assignment Module 2304 and to couple each of a plurality of test data lines that are coupled to the input side of the multiplexers 2316–2328 to core 2308. The described invention of FIG. 23 is advantageous in that an ID may be coded or embedded into hardware logic while maintaining the ability of a test data generator to produce test data to the input pins of a core device under tests that normally are for receiving ID values.

Figure 24:
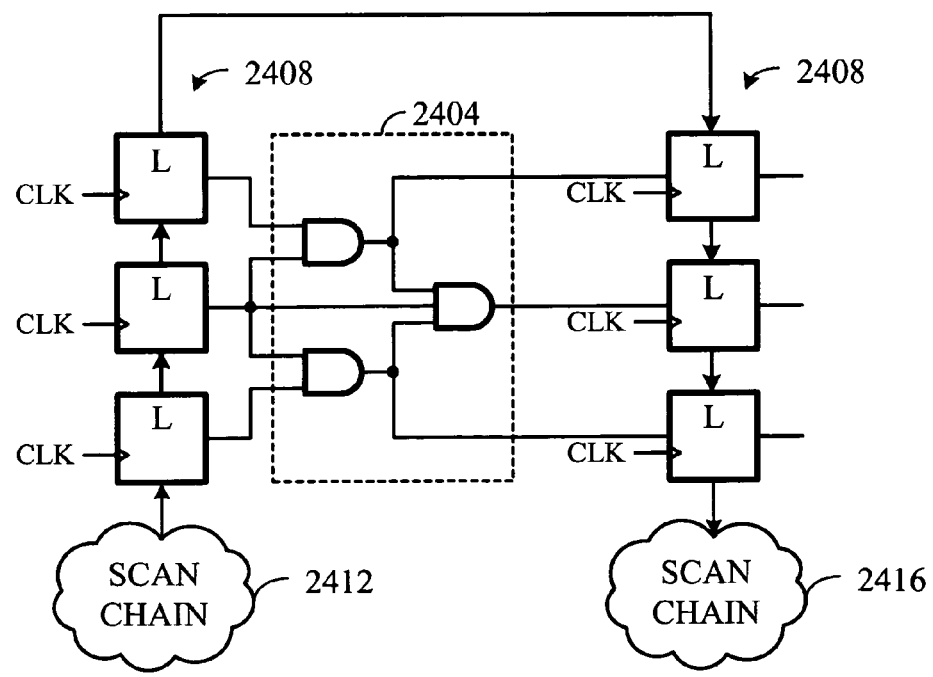
FIG. 24 is a functional block diagram illustrating a circuit in which scan data is scanned into and out of a scan chain to test a logic block.

FIG. 24 is a functional block diagram illustrating a circuit in which scan data is scanned into and out of a scan chain to test a logic block. As was previously described with reference to FIGS. 21 and 22, the gasket logic 2108 and 2128 and the fixed logic core processor 2116 must be tested after fabrication. Further, as was described, testing of the gasket logic 2108 and 2128 is performed by applying inputs to the gasket logic 2108 and 2128, receiving the output produced by the gasket logic 2108 and 2128 in response to the applied input, and comparing the output produced to expected output. As was further described, some of the functionality required for this testing is performed by configuring the FPGA fabric 2104 and operating the configured FPGA fabric 2104 to perform this testing. Additionally, as has been described, scan chains may be used to stimulate the logic being tested with test vectors.

Generally speaking, scan chain testing includes placing the device 2404 or circuit under test into a known state using configurations in the FPGA fabric. Test vectors are loaded into the scan chains 2412 and then are produced to the fixed logic device 2404 as inputs (applying particular inputs as stimulus), clocking the device 2404 for one or more clock cycles and then receiving and analyzing outputs states of the fixed logic processor. The test results may also be stored into the scan chain and be produced externally for evaluation.

More specifically, the manner in which the FPGA fabric may be configured to apply inputs to a logic circuit 2404 and may be configured to receive outputs of the logic circuit 2404 includes configuring the FPGA fabric to form a series of sequentially coupled latches to receive scan data. The sequentially configured latches 2408 are also coupled to the logic circuit 2404. The latches 2408 form a scan chain that is to receive test vectors that are scanned into it. Once the scan chain is fully loaded with test vectors (or one scan sequence), the test vectors are clocked into circuitry 2404. Additionally, the output of circuitry 2404 is produced to the output scan chain where the output values are latched and may be produced for evaluation.

When the logic circuit 2404 produces the output of interest, this output is latched into the output scan chain and then scanned out as shown at 2416. This data may then be compared to the output that is expected to be produced by the logic circuit 2404 for the given input test vectors.

Alternatively, the FPGA fabric may be configured to at least partially evaluate the output test results to determine proper functional operation. The output scan chain may be different logic circuitry than the input scan chain logic circuitry or, alternatively, the same logic circuitry configured to receive output data. Moreover, these operations occur in conjunction with the use of fixed logic core processor scan chains to place the fixed logic core processor into a desired state and to observe the state of the fixed logic core processor after stimulation with particular inputs. While the foregoing example illustrates a possibility of using scan chains to establish and test fixed logic devices and circuits formed within the gasket logic, it should be understood that scan chains are not necessarily required for such tests.

Figure 25:
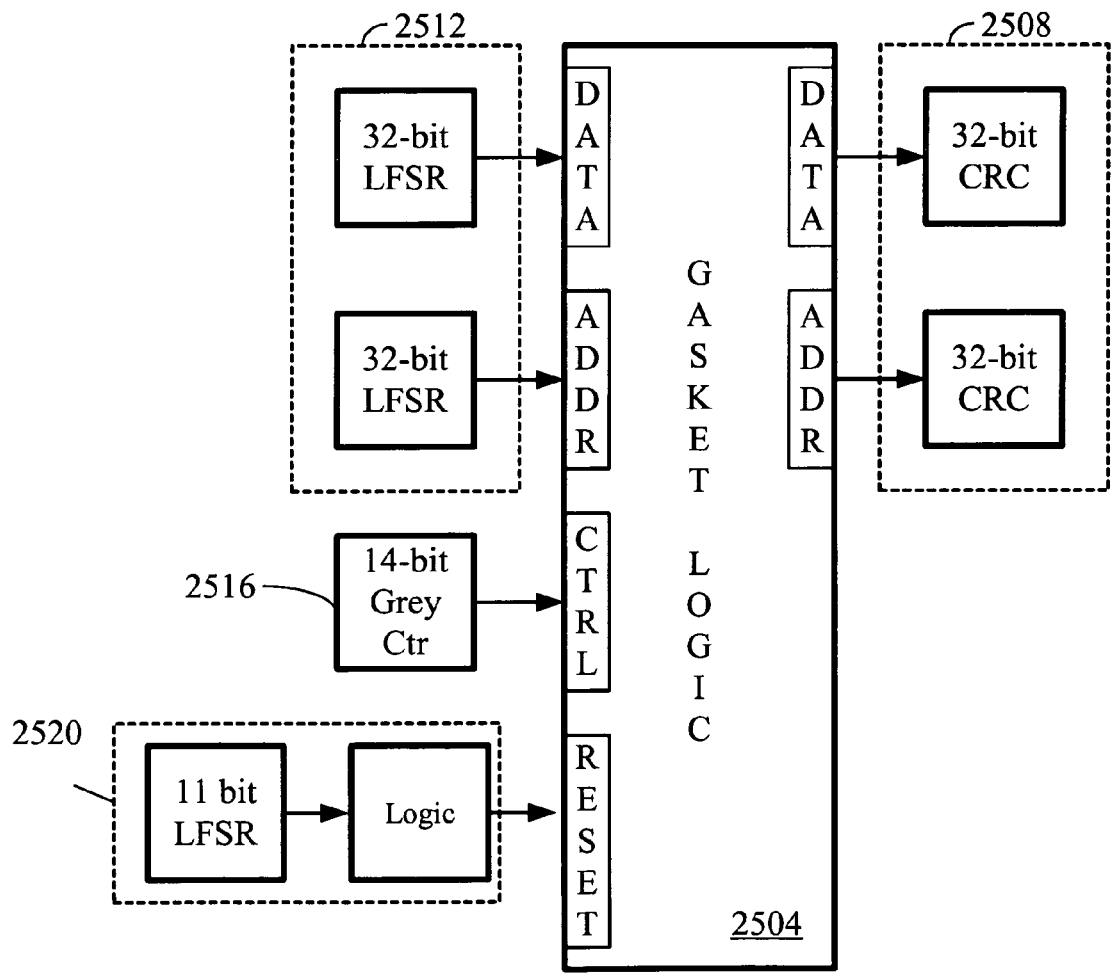
FIG. 25 is a functional block diagram illustrating a variety of test modules configured within an FPGA fabric and how they are used to test gasket logic according to the present invention.

FIG. 25 is a functional and exemplary block diagram illustrating a variety of test modules configured within an FPGA fabric and how they are used to test gasket logic according to the present invention. The gasket logic 2504 under test includes data input lines, address input lines, control input lines, and at least one reset line. The gasket logic 2504 also includes data output lines and address output lines. As was described particularly with reference to FIGS. 21 and 22, test circuitry is employed to isolate the gasket logic so that the configured FPGA fabric may test the gasket logic.

As shown, a pair of 32-bit linear feedback shift register (LFSR) counters 2512 stimulate the data input lines and address input lines of the gasket logic 2504. The LFSR counter 2512 generates a known pseudo-random sequence. Typical LFSR counters used herein during test are those that are able to generate the pseudo-random patterns for significant periods without repetition.

Additionally, a 14-bit Grey Code counter 2516 provides a Grey Code data pattern that stimulates the control inputs of the gasket logic 2504. A Grey Code data pattern is one in which only one bit of data is allowed to change from one generated number to a subsequently generated number. Grey Code counters are preferable for testing the control logic because they better simulate signal stability for input signals to a control module.

Finally, an 11-bit LFSR counter 2520 (containing decode logic as shown) stimulates the reset line(s) of the gasket logic 2504. The 11-bit LFSR counter (with the decode logic) 2520 produces a reset signal for the gasket logic 2504 after approximately 1,100 clock cycles in the described embodiment of the invention.

The combination of the inputs provided by the 32-bit LFSR counters 2512, the 14-bit Grey Code counter 2516, and the 11-bit LFSR counter 2520 fully stimulate the inputs of the gasket logic 2504. Based upon simulation results, the gasket logic 2504 will produce a particular output at each testing clock cycle. The outputs of the gasket logic 2504 are produced at the data lines and the address lines. These outputs are received by two 32-bit Cyclic Redundancy Check (CRC) modules 2508 configured in the FPGA fabric. Based upon expected outputs, approximately every 150,000 clock cycles in one described embodiment of the invention, the CRC modules 2508 will output a particular data pattern that may be used by the tester for examination for an expected data pattern. When the expected data pattern is not received as expected at a specified test point, e.g., the 150,000$^{th}$ clock cycle, the gasket logic 2504 has failed its testing. It is understood that the above described embodiment is exemplary and may be modified as necessary or derived without departing from the inventive concepts disclosed herein.

Figure 26:
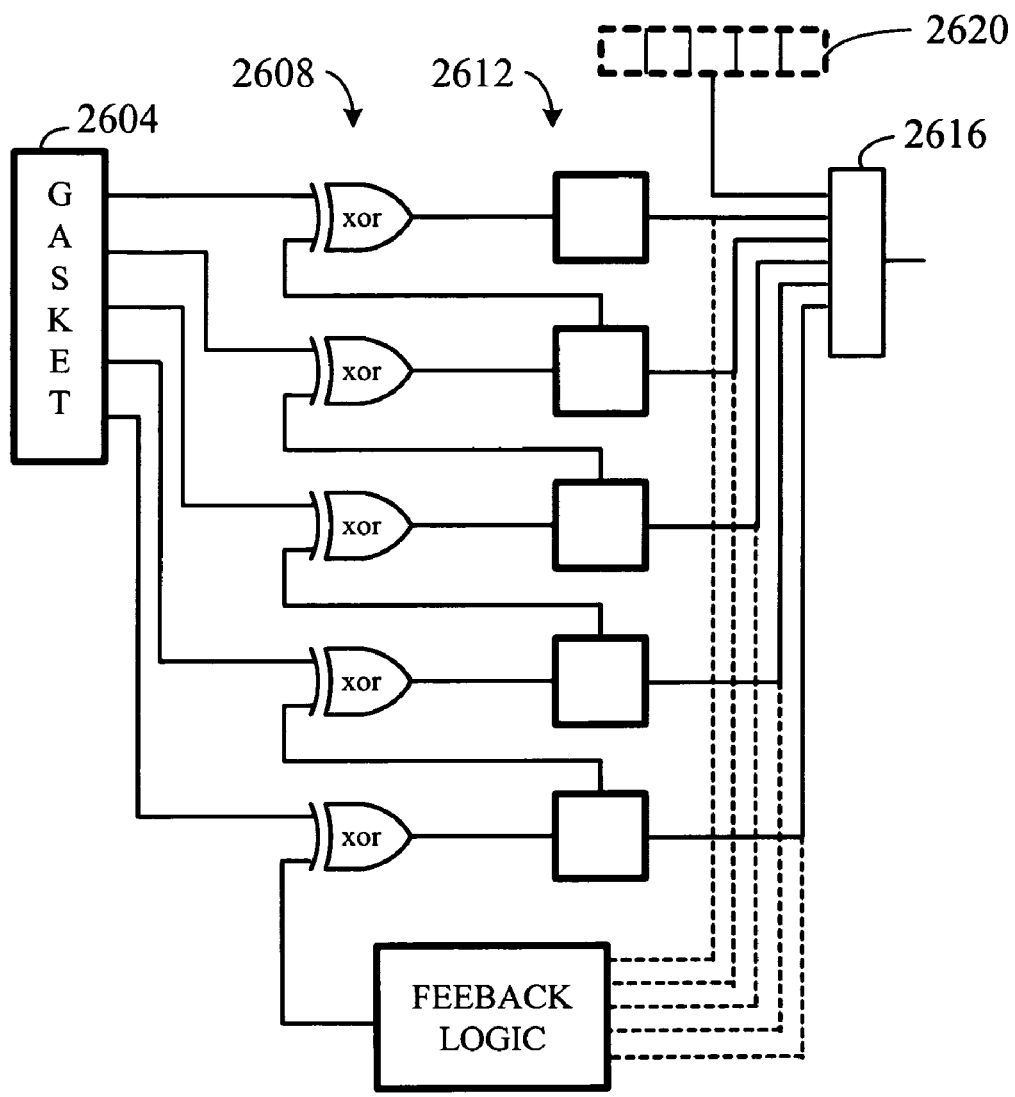
FIG. 26 illustrates a portion of CRC circuitry used to receive the outputs from the gasket logic and to provide the output for comparison purposes.

FIG. 26 is a functional and exemplary block diagram that illustrates a portion of the MISR circuitry used to receive the outputs from the gasket logic and to provide the output for comparison purposes. The structure of FIG. 26 is configured in the FPGA fabric during gasket logic testing registers. The illustrated portion of the MISR circuitry receives a plurality of inputs from the gasket logic 2604. These inputs are provided to a plurality of exclusive OR (XOR) gates 2608, each of which also receives as its second input the output of an adjacent latch (corresponding to an adjacent data line). These latches are shown generally at 2612. Note that for a 32-bit MISR circuit, 32 XOR gates and 32 latches, and a 4-Bit XNOR tapped off of bits 32, 22, 2 and 1 would be included in the described embodiment of the invention.

At each clock cycle, the XOR gates 2608 combine the value produced by the gasket logic 2604 with the data value of the adjacent latch. The resulting output produced by the XOR gates is then latched into the corresponding latch for use in the subsequent clock cycle/gasket logic data cycle. After a specified number of clock cycles, e.g., 150,000 in the described embodiment, the latches 2612 hold a unique data value. This unique data value may be converted to serial data via multiplexer 2616 and output to a tester conducting the test of the FPGA. The tester may then compare this unique data value to an expected/correct data value. Alternately, the expected/correct data value may be loaded into the MISR module as a data value from register 2620 and compared by logic circuitry with the value produced. More specifically, a comparator connected in place of multiplexer 2616 compares the values found in the shift register 2620 with the expected/correct value. The result of this comparison may then be output to the tester in place of serial outputs from multiplexer 2616. It is understood the system of FIG. 26 is functional in nature and explains the general concept of applying a signature function to sequentially generated outputs for functional evaluation. Any known design for applying a signature function (such as a CRC) may be used in place of that which is shown in FIG. 26.

Figure 27:
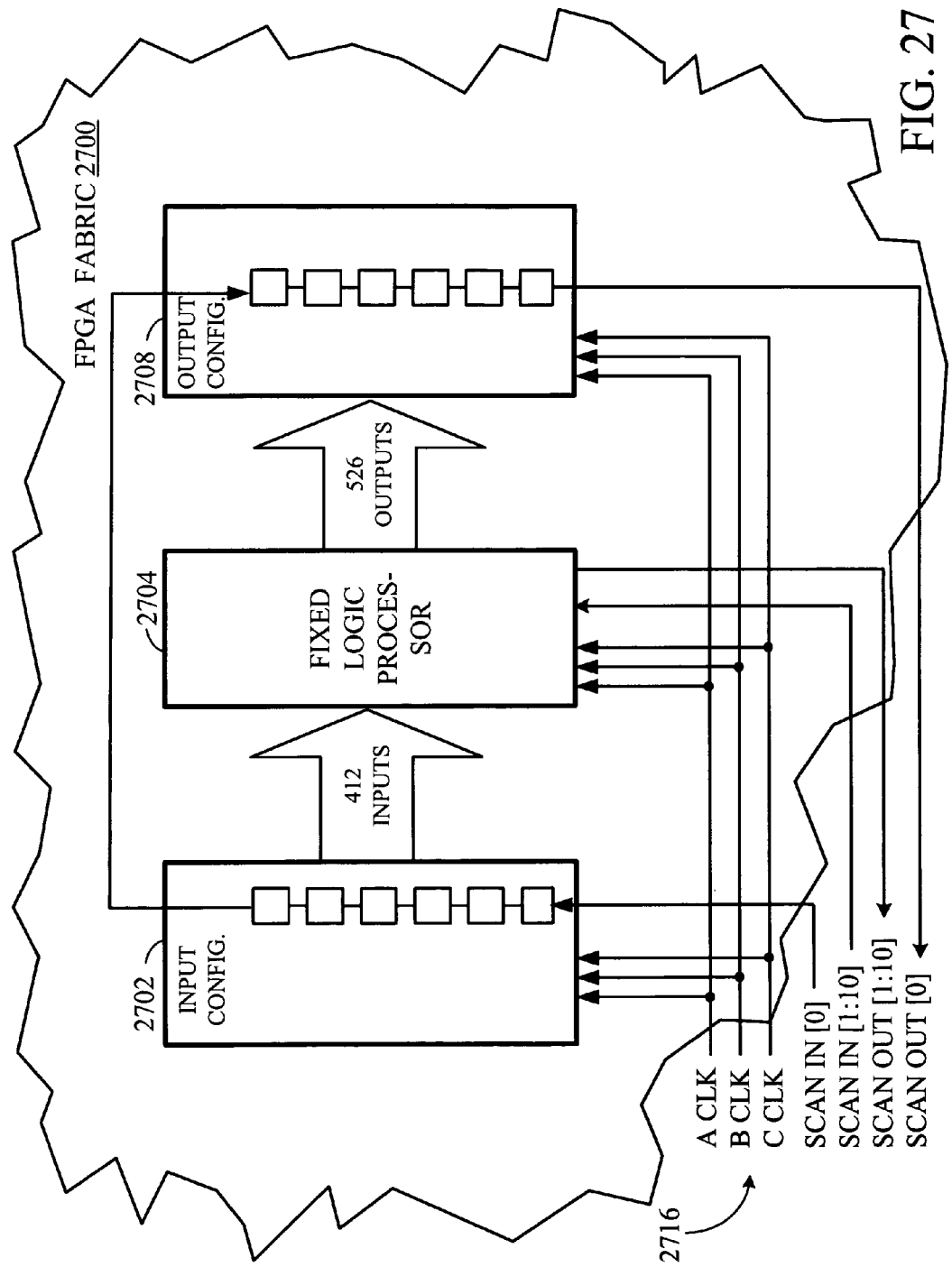
FIG. 27 is a functional block diagram illustrating the manner in which clocks, input/output vectors, and scan test vectors are applied to test a fixed logic core that is embedded within an FPGA fabric according to the present invention.

FIG. 27 is a functional block diagram illustrating a configuration used for testing a fixed logic core processor embedded within an FPGA fabric according to the present invention. More specifically, an FPGA fabric 2700 includes an embedded fixed logic core 2704 that may be a microprocessor, a digital signal processor, an input/output device, or another fixed logic device. The particular fixed logic core described with reference to FIG. 27 is an IBM PowerPC 405 that includes 412 input lines and 526 output lines.

During test, a scan chain (here, scan chain "0") is loaded into FPGA circuitry. Moreover, the core 2704 is placed into a known state using its ten scan chains and scan chain clocking inputs since core 2704 is a PowerPC 405. Then all, or a portion, of the 412 inputs are stimulated by the FPGA fabric and its scan chain (and test vectors) and the core 2704 is clocked. At a next clock cycle, a different set of inputs may be applied and the core 2704 may be clocked again. This procedure is repeated for a plurality of clock cycles. After the particular testing sequence is completed, the state of the core 2704 is retrieved using its ten scan chain outputs, and some or all of the plurality of outputs are retrieved and compared to expected/correct values derived from simulation. This test sequence will typically be repeated a number of times to obtain substantial fault coverage of the core 2704.

Thus, according to the present invention, test circuitry and communication paths are configured in the FPGA fabric 2700 that work in conjunction with a tester to test the core 2704. After configuration of the FPGA fabric 2700 for testing purposes, the test configuration includes an input configuration 2702, an output configuration 2708, and a plurality of off-chip connections. These off-chip connections allow the tester to provide control signals such as A, B, and C clocks to the input configuration 2702, the core 2704, and the output configuration 2708. These off-chip connections also allow the tester to apply SCAN IN [1:10] data and to receive SCAN OUT [1:10] data. In addition to this FPGA fabric 2700 configuration, the gasket logic surrounding the core 2704 is also placed into a state that provides direct access by the FPGA fabric 2700 to the core 2704 (see description of FIG. 21 or 22).

The input configuration 2702 includes a plurality of logic blocks, each of which forms a portion of a scan chain that provides one or a plurality of the 412 inputs to the core 2704. One particular structure of such logic blocks is illustrated with reference to FIG. 28A. The input scan chain of the input configuration 2702 is connected to receive SCAN IN [0] data that is provided by the tester.

The FPGA fabric 2700 is also configured to provide access to the ten input scan chains of the core 2704, SCAN IN [1:10] and to the ten output scan chains of the core 2704, SCAN OUT [1:10]. With this configuration of the FPGA fabric 2700, a tester having access to the input/output of the FPGA fabric 2700 has direct access to the scan chains of the core 2704.

The output configuration 2708 receives some or all of the 526 outputs of the core 2704, latches the outputs upon direction of the tester coupled to the FPGA fabric 2700, and scans out the latched data as SCAN OUT [0] that is received by the tester. The structure of a plurality of logic blocks making up the output configuration 2708 may be similar to the structure described with reference to FIG. 28A.

Additionally, the A clock, B clock and C clock signals described in relation to FIG. 28 are also provided to the fixed logic core processor by way of the FPGA and the gasket logic formed around the fixed logic core processor. The latches used for scan chains may be the same set of latches or different sets of latches, one for each function.

Figure 28A:
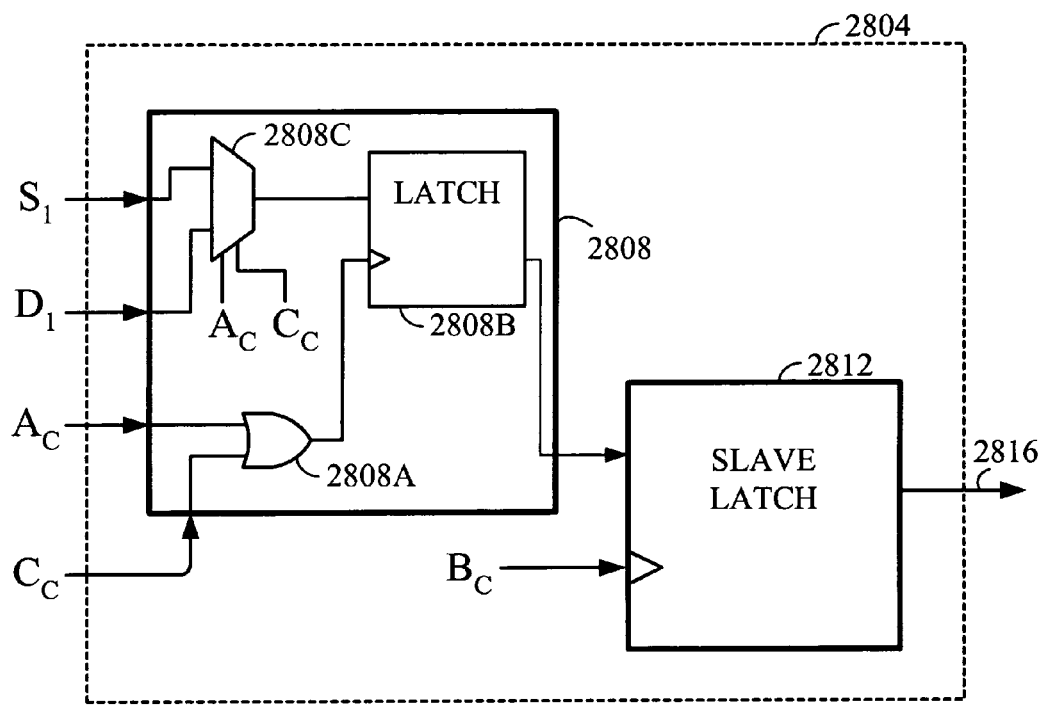
FIG. 28A illustrates a double latch shift register that is used in one embodiment of the logic blocks of the input configuration 2702 of FIG. 27.

FIG. 28A illustrates a latch shift register 2804 that is used in one embodiment of the logic blocks of the input configuration 2702 of FIG. 27. The latch shift register 2804 includes a pair of modules (latches) 2808 and 2812. The first latch 2808 includes a multiplexer 2808C, an OR gate 2808A, and a latch 2808B that performs a desired latching function.

The first latch 2808 is coupled to receive a scan (test) signal (S), a data signal (D), an A clock (A), and a C clock (C). In the described embodiment, the clock signals are broadcast signals. The Multiplexer 2808C is used to select between two data sources (S and D) and is clocked by an input that is coupled to the output of OR gate 2808A. Thus, latch 2808B is clocked upon the clock pulse of either one of the A clock or the C clock to receive either the test signal (S) or data signal (D).

Figure 28B:
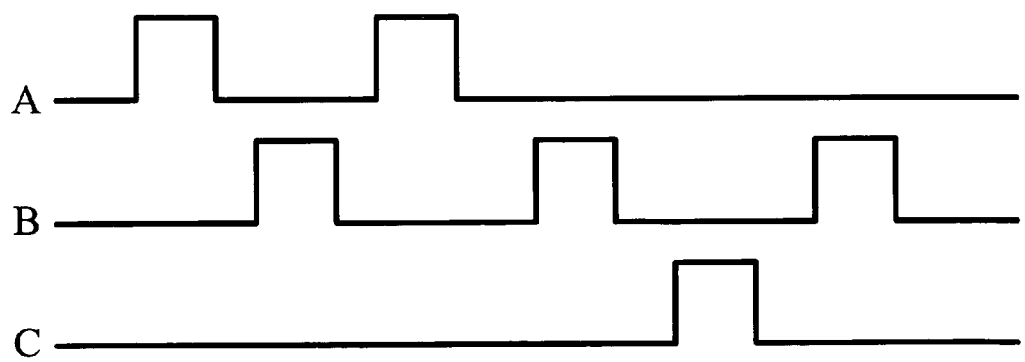
FIG. 28B is a timing diagram illustrating the timing of the application of various clock signals according to the method for testing a fixed logic core according to one embodiment of the present invention.

The second slave latch 2812 is a slave latch that receives the output of latch 2808B. Slave latch 2812 is driven by the B clock, however, and therefore its latching can be configured to occur independently of the events and clocks that drive latch 2808B. As is shown in FIG. 28B, a "B" clock pulse is set to occur after either an "A" clock or a "C" clock pulse to enable the slave latch to capture data regardless of the source (regardless of whether the data is real or is test data).

More specifically, the output of latch 2808B is coupled to the data input of slave latch 2812. The clock input of slave latch 2812 is also coupled to receive the B clock signal. Accordingly, upon the receipt of the B clock pulse from the third clock source, the output value of latch 2808B is input into latch 2812 and latched to produce the corresponding bit (or multiple bits) on its output line. This data is then applied to the PowerPC core.

During a series of scanning operations, the output of the first latch 2808B is received by the input of an adjacent logic block 2804. This structure allows a scan vector to be input into a plurality of these circuits that form a scan chain for input to the fixed logic PowerPC core. Once all of the latches are loaded with input test data, the test data (test vectors) may be produced to the DUT for test by way of output 2816. Furthermore, this structure allows the logic state of PowerPC core to be captured and scan out to be evaluated, also by way of output 2816.

Figure 29:
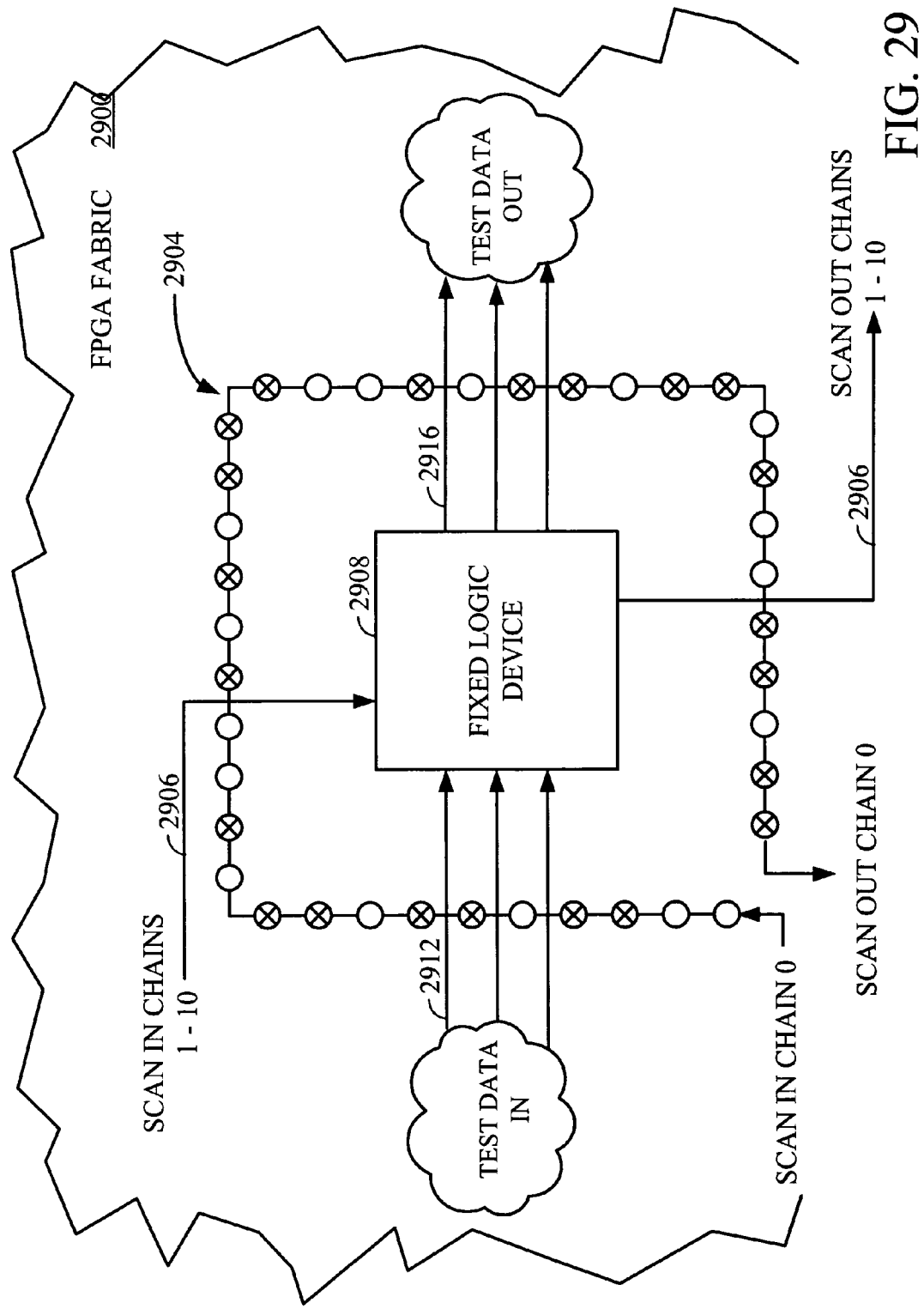
FIG. 29 is a functional block diagram illustrating the use of a scan chain in an FPGA fabric to test an embedded device according to on aspect of the present invention.

FIG. 29 is a functional block diagram illustrating the use of a scan chain in an FPGA fabric to test an embedded device according to one aspect of the present invention. As mentioned before, a plurality of test configurations may be defined, each of which is for performing a specified test. Thus, one particular scan chain is for establishing logic states and circuit configuration within the FPGA fabric to support testing of the embedded device, as shown in the functional block diagram of FIG. 29.

As may be seen, a plurality of shift registers within the FPGA fabric are configured as a scan chain 2904 to facilitate the transmission of test vectors into the embedded device and to facilitate receiving data with test results through the scan chains from the embedded device, among other functions. In the described embodiment of the invention, different scan chains are loaded into the FPGA to accomplish these different results.

The gasket logic portion comprises, in the described embodiment of the invention, approximately 600 pins. The Power PC chip, on the other hand, comprises nearly 1,000 pins. Accordingly, the use of the scan chains to establish circuit conditions is important to significantly reduce the number of communication paths that must be established to the device under test through the FPGA fabric and the gasket logic and to reduce the processing steps to set up a desired set of logic states to support test conditions.

Continuing to refer to FIG. 29, scan chain 2904 therefore facilitates the creation of communication channels (through scan in chain 0), shown generally at 2912, for transmitting test data (represented by an "x" in the circles that represent the scan latches) directly into fixed logic device 2908 and then out of fixed logic device 2908 at the communication channels shown generally at 2916 for receiving test data outputs from the fixed logic device 2908 (through scan out chain 0). Additionally, configured path 2906 establishes the communication paths through the FPGA fabric 2900 to defined communication channels of the fixed interfacing logic circuitry for transmitting scan chains 1–10 for the embedded core device, and for receiving output scan chains 1–10 with internal processing results from it.

As is understood, the scan chain 2904 is particular to the type of embedded fixed logic device 2908. Stated differently, each type of embedded device requires different couplings for stimulating the device, as well as for transmitting and receiving communication signals through established communication channels. For example, the fixed logic device 2908 (an IBM PowerPC) requires channels for receiving test data and for outputting test data, as well as communication channels for receiving and outputting scan chains 1–10.

Figure 30:
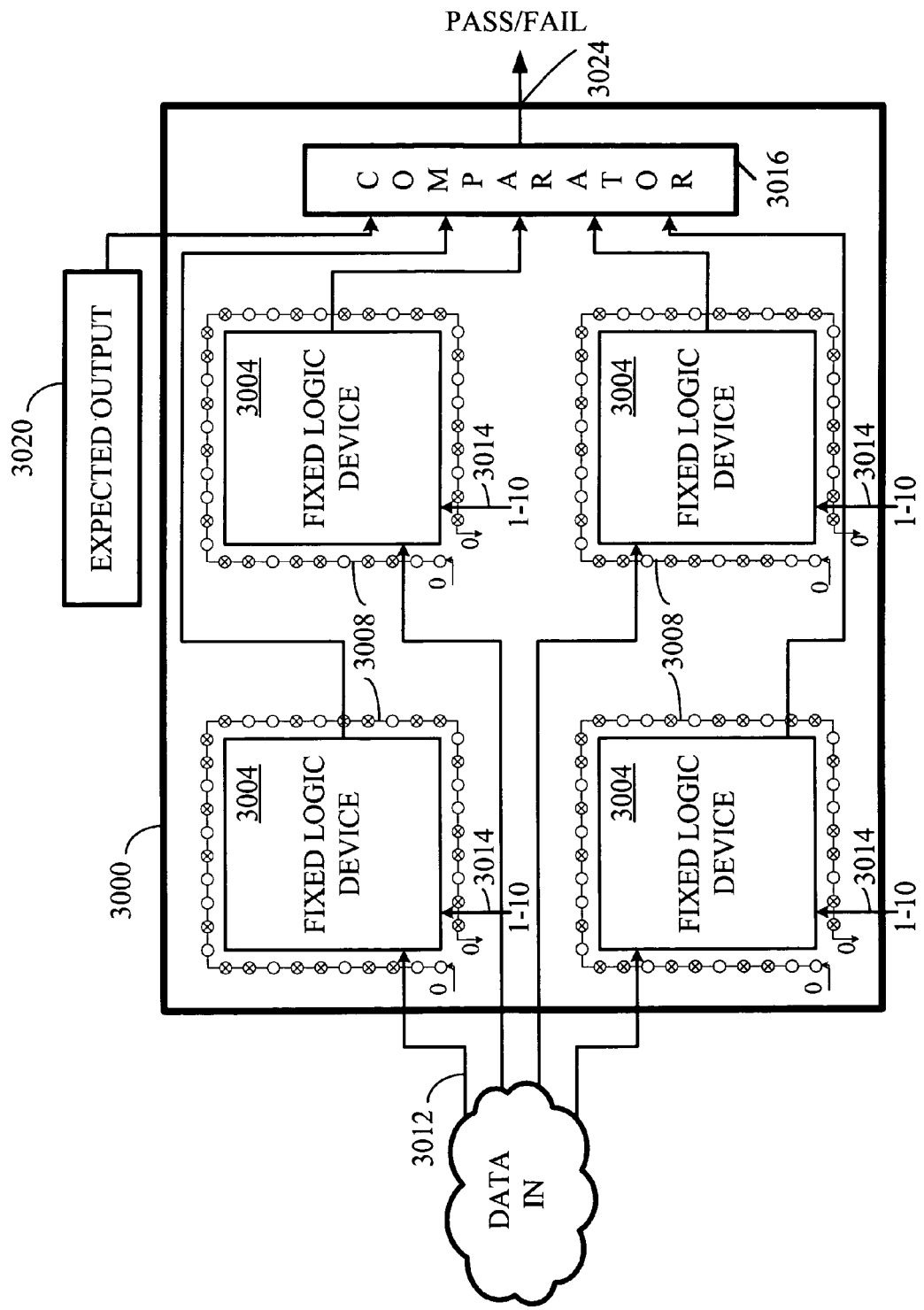
FIG. 30 is a functional schematic diagram of an FPGA constructed according to one embodiment of the invention that includes a plurality of embedded devices.

FIG. 30 is a functional schematic diagram of an FPGA constructed according to one embodiment of the invention. More particularly, an FPGA fabric includes gasket logic that further includes a plurality of embedded core processor blocks. In the described embodiment, an FPGA fabric 3000 that includes four core processor blocks 3004, each of which is an embedded device of the same type in the described embodiment.

The FPGA 3000 is formed to receive scan chains 3008 to facilitate testing of the embedded devices. Each of the core processor blocks further is coupled to receive test data through a plurality of communication paths, shown generally at 3012, that are created by logic states of the logic circuitry of the FPGA as well as by the gasket logic. Additionally, each of the core processors 3004 is coupled to receive scan chains for internal tests through a plurality of communication paths 3014. While the example of FIG. 30 illustrates test data being received from an external source, an alternate approach includes having the FPGA 3000 generate the test data.

While not specifically shown, it is understood that the circuitry further defines communication paths for the transmission of a plurality of clock signals to each of the scan chains. For example, the A clock, B clock and C clock for the shift registers that receive the scan chains, as described herein in relation to FIG. 27, are transmitted through communication paths not shown herein.

Given the synchronous operation that necessarily occurs responsive the receipt of the clock pulses by each of the embedded fixed logic core processor blocks 3004, as well as the parallel test data streams, each of the core processor blocks 3004 produces similar outputs at or about the same instant, assuming proper circuit operation.

The outputs of each core processor block 3004 are produced to a comparator 3016 where their values may be compared to each other and to an expected output value received from a memory 3020 that is used for storing the expected value. If the expected value is the same as the output value of all four core processors, the comparator 3016 produces a "pass" indication on output logic path 3024. Comparators such as comparator 3016 are known.

In an alternate embodiment of the invention, the outputs of the core processor blocks 3004 are merely compared to each other and are not compared to a stored value from a memory, which stored value reflects an expected output value. For this alternate embodiment, the assumption is made that the probability all four processors 3004 having a failure that produces the same result is so low that the risk of such a failure going undetected is acceptable. In the described embodiment, however, comparing the actual outputs to an expected value precludes such a possibility, however slight.

The system of FIG. 30 illustrates an embodiment of the invention wherein the core processor blocks 3004 all contain the same type of core processor as an embedded device. If, for example, the embedded devices are of a different type, as will be the case for some embodiments, one of several approaches may be pursued. First, if a tester has the capacity to generate test signals for multiple devices at the same time (meaning it has adequate input and output capacity for supporting the multiple devices), then scan chains particular to the device being tested are loaded around the core processor blocks and input data unique to the embedded device is produced thereto. Alternatively, scan chains are loaded only for the device under test and corresponding data is produced thereto. Feasibly, four tests would be performed for a system similar to that shown in FIG. 30 if each embedded device is different.

Figure 31:
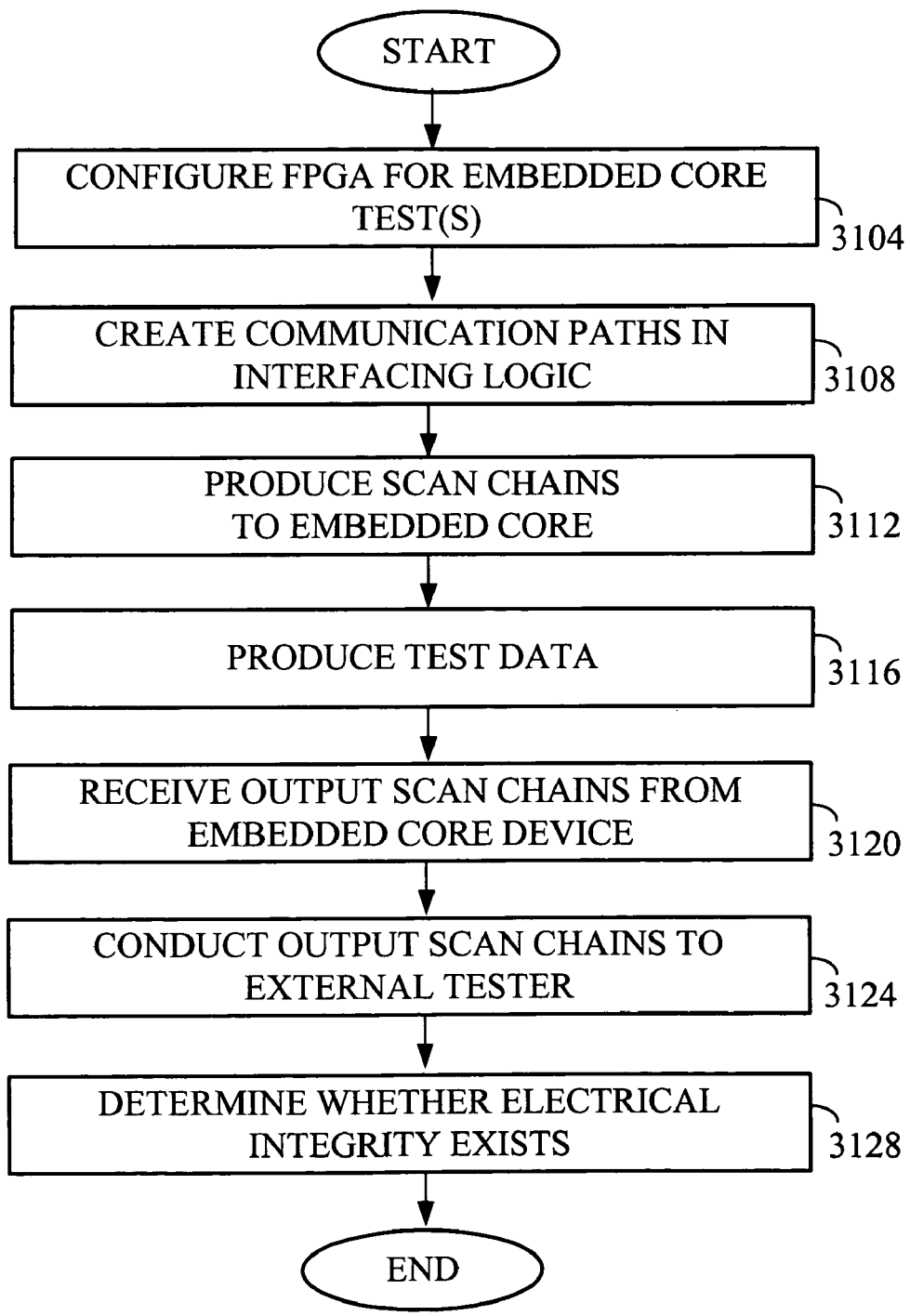
FIG. 31 is a flow chart illustrating a method for testing a device that is embedded within fixed logic circuitry that is itself at least partially embedded within an FPGA according to one embodiment of the invention.

FIG. 31 is a flow chart illustrating a method for testing an embedded core device according to one embodiment of the present invention. As has been described before, the FPGA disclosed herein includes an embedded cored device that is surrounded by interfacing logic that is for interfacing the embedded cored device to the FPGA fabric, among other purposes. A first step in testing such an embedded core device, therefore, is to configure the FPGA into a mode for performing the testing of the embedded core device (step 3104). As a part of configuring the FPGA for the embedded core test, communication paths in the interfacing logic must be created or made electrically present (step 3108). These communication paths are useful for producing scan chains, if necessary, to the embedded core device, as well as for producing test data. Thus, the next step includes producing test vectors within the scan chains to the embedded core device (step 3112). Additionally, the inventive process includes producing test data and conducting the test data through the interfacing logic to the inputs of the core device (step 3116). Once the test has been set up through the scan chains and through the data being produced to the device under test, a clock pulse is generated to prompt the embedded device to process the data and produce resulting outputs. Accordingly, the invention includes, after generating the clock pulse, receiving output scan chains, or at least one output scan chain, from the embedded core device (step 3120). The output scan chains are then conducted to an external tester (step 3124) where it may determine whether electrical integrity or functional integrity exists (step 3128).

Figure 32:
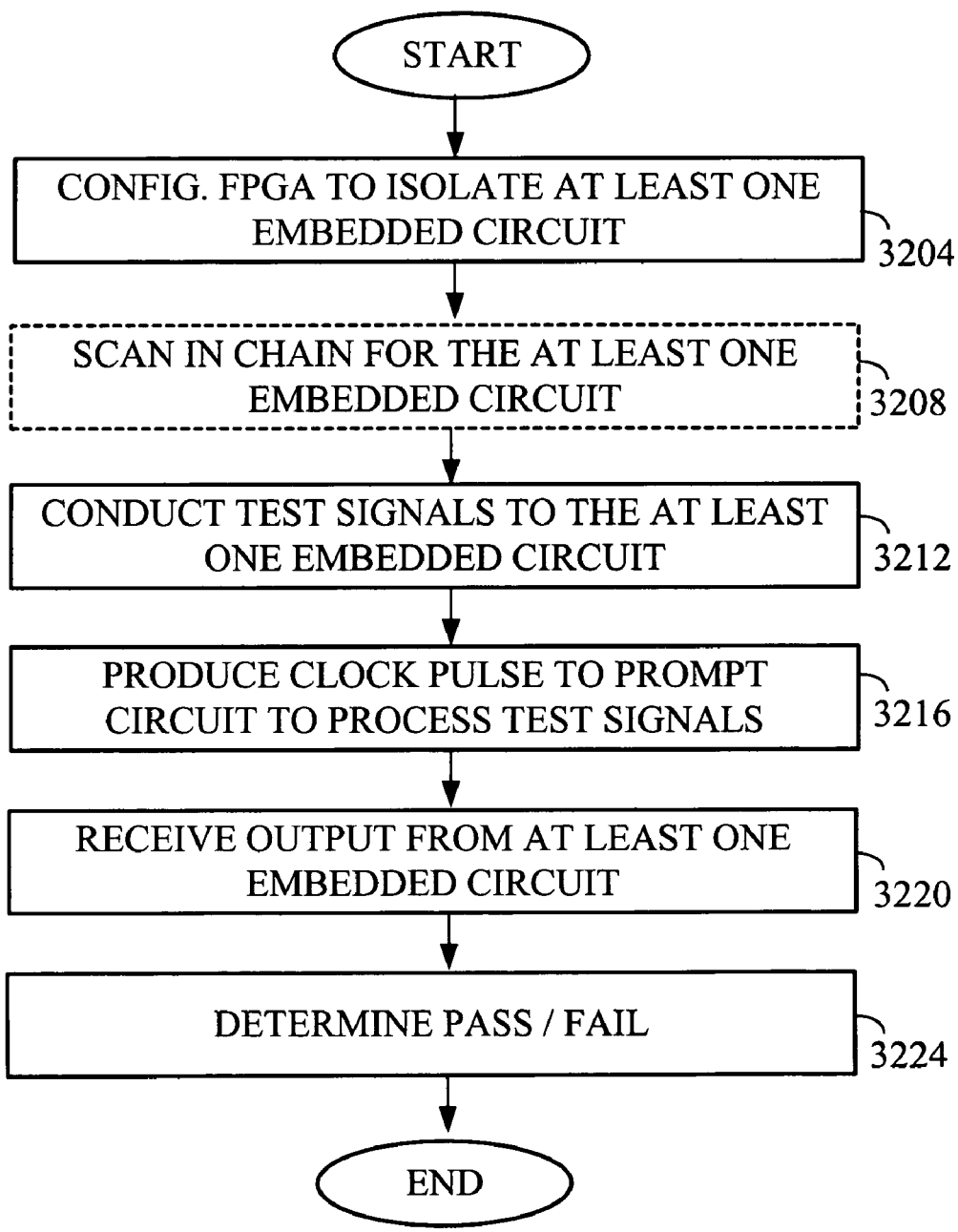
FIG. 32 is a flow chart illustrating a method for testing an embedded device that is embedded within an ASIC that is within an FPGA according to one embodiment of the invention.

FIG. 32 is a flow chart illustrating a method for testing at least one embedded circuit within an FPGA according to one embodiment of the present invention. Referring now to FIG. 32, the FPGA must be configured to isolate at least one embedded circuit (step 3204). As was described herein, the test circuitry is not only created by the creation of select configurations of the FPGA fabric, but also by causing designated circuit elements to become electrically present while the FPGA is in a test mode of operation. For example, multiplexers are formed within the interfacing logic of the FPGA, which multiplexers are for isolating circuit devices and for facilitating the delivery and receipt of test signals there to and there from. Thus, once a device has been isolated, a scan chain is scanned in for the device if the device is of a type that utilizes scan chains for test purposes (step 3208). For example, if the device under test is a PowerPC, then its set of scan chains would be connected to for test purposes. On the other hand, if the device under test were merely a circuit element that is a part of the fixed interfacing logic, then no scan chain would be loaded into the device. Once the FPGA and test circuitry are configured to perform tests, then test signals are conducted to the at least one embedded circuit (step 3212). As was described previously, a plurality of devices may be embedded into the FPGA and surrounded by fixed interfacing logic. Accordingly, in such an embodiment, the step of conducting test signals to at least one embedded circuit would include conducting test signals to all of the embedded test circuits.

Once the test signals have been conducted to the at least one embedded circuit, a clock pulse is produced to each of the at least one embedded circuits to prompt them to process the test signals (step 3216). Thereafter, the outputs are received from the at least one embedded circuit (step 3220) and the system determines whether the device passed or failed (step 3224).

Figure 33:
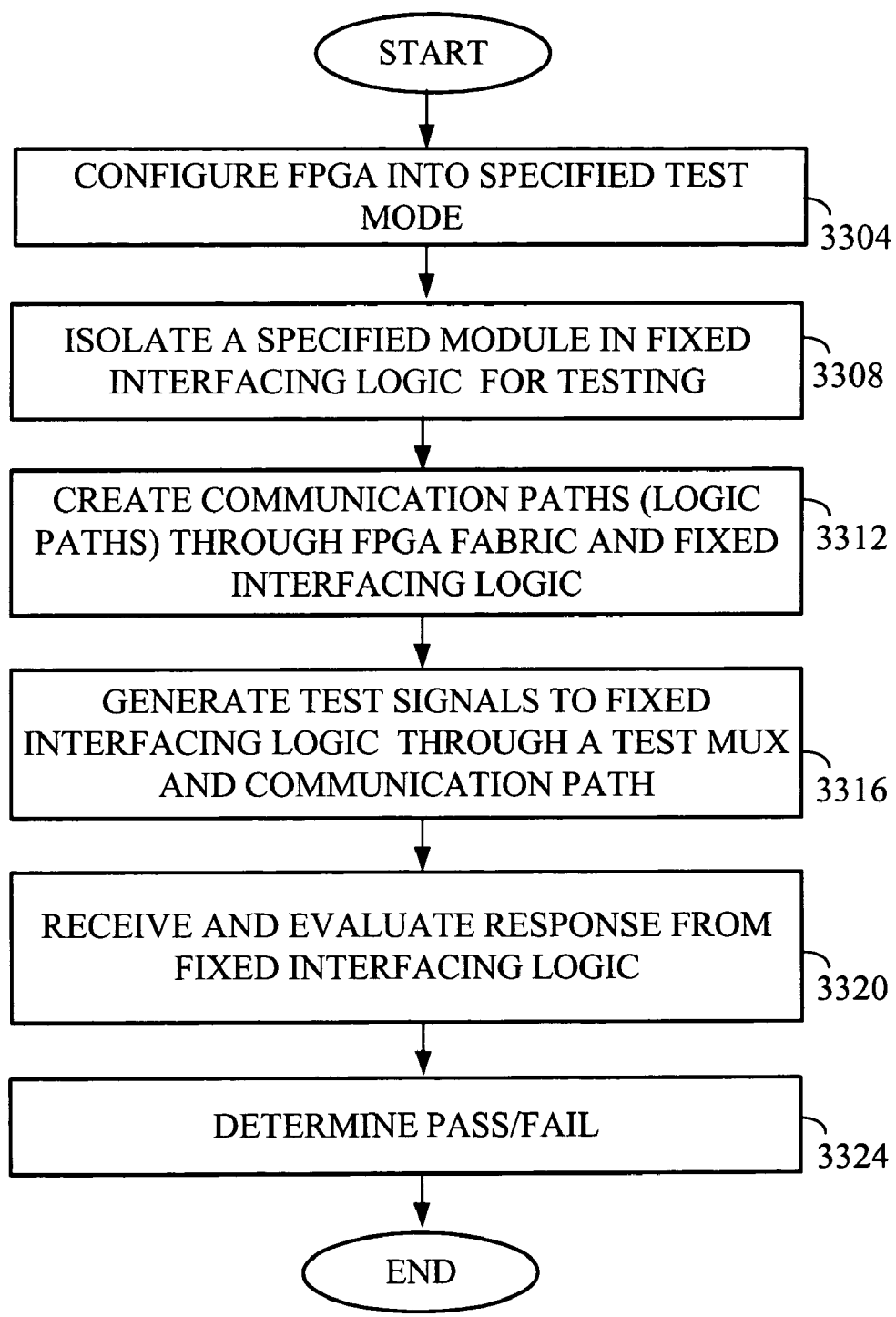
FIG. 33 is a flow chart illustrating a method for testing a module embedded within an ASIC that, in turn, is embedded in an FPGA according to one embodiment of the present invention.

FIG. 33 is a flow chart illustrating a method for testing a specified circuit element or module formed within the fixed interfacing logic of an FPGA according to one embodiment of the present invention. Referring now to FIG. 33, the first step is to configure the FPGA into a specified test mode (step 3304). For example, the specified test mode can be one that is for testing an embedded core device or, as here, for testing a specified circuit element or module of the fixed interfacing logic. Thereafter, the specified circuit element or module that is to be tested is isolated for test purposes (step 3308). By isolated, what is meant is that test multiplexers are made electrically present to define new and temporary communication paths through the fixed interfacing logic that are used for test purposes. Thus, in addition to isolating the specified module, the communication paths for performing the tests are created through the fixed interfacing logic, as well as through the FPGA fabric because of its test configuration (step 3312).

The preceding steps relate to preparing the FPGA to perform at least one specified test. Thus, once the FPGA is ready to perform the test, test signals are generated to the fixed interfacing logic through the FPGA fabric, and then in the fixed interfacing logic, through a test mode and communication path (step 3316). The communication path referred to in step 3316 is one that was created for test purposes or made electrically present for test purposes within the fixed interfacing logic. Once a clock pulse has been generated to prompt the device to process the test signals, the method includes receiving and evaluating the response from the device in the fixed interfacing logic to determine whether it has passed or failed (step 3320). Thus, the final step includes making the determination of whether the circuit element of the fixed interfacing logic passed or failed the test (step 3324).

The inventive method and apparatus disclosed herein are particularly advantageous in that they provide a capability for testing a device that is embedded within an FPGA fabric. While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A method for testing a fixed logic device formed within a gasket, comprising:
   receiving an FPGA scan chain and configuring an FPGA fabric portion for a specified test;
   producing a first test signal and a second test signal in the FPGA fabric portion;
   providing the first test signal as input to an isolation circuit element;
   providing the second test signal to a programmable interconnect resource;
   selecting for input to the fixed logic device between the first signal and the second signal in response to a test mode configured in the FPGA fabric portion;
   receiving an output test signal from the fixed logic device;

applying a signature function to the received output test signal;

repeating the producing, receiving and applying steps for a specified number of times; and determining if a value of the signature function corresponds to an expected value.

2. The method of claim 1 further comprising the step of isolating the fixed logic device that is to be tested.

3. The method of claim 1 further comprising the step of receiving an output test signal from the fixed logic device by way of an isolation circuit element.

4. The method of claim 1 wherein the determining step is performed by logic within an FPGA fabric portion.

5. The method of claim 1 wherein the determining step is performed by an external tester.

6. The method of claim 1 wherein the determining step includes the step of comparing the signature to an expected value.

7. An FPGA, comprising:
an FPGA fabric portion;
a Gasket formed at least partially within the FPGA fabric portion, the Gasket forming interfacing logic between an embedded core device and the fabric portion; and
isolation circuitry formed within the Gasket, the isolation circuitry being serially coupled to receive test signals from the FPGA fabric portion, isolate the embedded core device from the Gasket during testing of the embedded core device, and isolate the Gasket from the embedded core device during testing of the Gasket.

8. The FPGA of claim 7 wherein the isolation circuitry includes a multiplexer array, which multiplexer array facilitates sending test signals directly to the embedded core device.

9. The FPGA of claim 7 wherein the isolation circuitry includes a multiplexer array, which multiplexer array facilitates sending test signal outputs directly from the embedded core device to the FPGA fabric.

10. An FPGA, comprising:
an FPGA fabric portion;
a Gasket formed at least partially within the FPGA fabric portion, the Gasket forming interfacing logic between an embedded core device and the fabric portion;
a first multiplexer coupled to receive a first test signal from the FPGA fabric portion by way of a communication path formed within the Gasket portion, wherein the communication path is accessible while the FPGA is configured for testing at least a portion of the Gasket; and
a fixed logic device formed within the Gasket, the fixed logic device being coupled receive a second test signal from the FPGA fabric portion and provide the second test signal to the first multiplexer, wherein the first multiplexer selects between the first test signal received from the FPGA fabric portion and the second test signal for input to the embedded core device in response to a test mode configuration of the FPGA fabric portion.

11. The FPGA of claim 10, further comprising a second multiplexer coupled to receive an output signal from an embedded core device and a third test signal from the FPGA fabric portion, and to select between the third test signal and the output signal from the embedded core device for input to the fixed logic device in response to a test mode configuration of the FPGA fabric portion.

12. An FPGA, comprising:
ID circuitry for delivering a device ID to an embedded device;
input circuitry for receiving test signals from test circuitry; and
multiplexer circuitry coupled to receive input test signals and control signals from the input circuitry and ID information from the ID circuitry, and to produce selected input signals to the embedded device.

13. The FPGA of claim 12 further comprising test circuitry coupled to the input circuitry to produce test and control signals thereto.

14. The FPGA of claim 12 being configurable to connect the input circuitry to pins that may be connected to external test equipment, which external test equipment is for producing test signals that are received by the multiplexer circuitry and conducted to the inputs of the embedded device.

15. An FPGA configured in a test mode of operation, comprising:
an FPGA fabric portion;
a Gasket formed at least partially within the FPGA fabric portion, the Gasket forming interfacing logic between an embedded core device and a subset of the FPGA fabric portion;
a first multiplexer coupled to receive a first test signal from the FPGA fabric portion by way of a communication path formed within the Gasket portion, wherein the communication path is accessible while the FPGA is configured for testing at least a portion of the Gasket;
a fixed logic device formed within the Gasket, the fixed logic device being coupled to receive a second test signal from the FPGA fabric portion and provide the second test signal to the first multiplexer, wherein the first multiplexer selects between the first test signal received from the FPGA fabric portion and the second test signal for input to the embedded core device in response to a test mode configuration of the FPGA fabric portion;
first logic circuitry forming a plurality of latches for receiving an FPGA scan chain containing test vectors;
second logic circuitry forming a test output signature generator;
third logic circuitry configured for performing a specified test; and
fourth logic circuitry for determining whether the FPGA passed or failed a test.

16. The FPGA of claim 15 wherein each of the first, second and third logic circuitry are formed to communication with the fixed logic device.

17. The FPGA of claim 16 wherein the fixed logic device is an embedded core processor.

18. A programmable logic device (PLD), comprising:
an integrated circuit, including,
a configuration memory arranged for storage of bit values that program functions of programmable logic resources and programmable interconnect resources of the PLD;
a plurality of programmable logic resources coupled to the configuration memory;
a plurality of programmable interconnect resources coupled to the configuration memory and to the programmable logic resources;
a fixed logic circuit; and
an interface circuit including,
a plurality of programmable switches coupled to the subset of the programmable interconnect resources;

a fixed interface circuit coupled to the plurality of switches; and a selector circuit arrangement coupled to the fixed interface circuit, to the fixed logic circuit, and to the interconnect resources, the selector circuit arrangement adapted to, for input to each of a plurality of input pins of the fixed logic circuit, select between a signal from the fixed interface and a signal from the interconnect resources.

19. The PLD of claim 18, wherein the selector circuit is further adapted to, for input to each of a plurality of input ports of the fixed interface circuit, select between a signal from an output port of the fixed logic circuit and a signal received from the interconnect resources.

20. The PLD of claim 19, wherein:

the integrated circuit further includes a non-volatile memory adapted for storage of a device identifier; and the interface circuit further includes an ID selector circuit arrangement coupled to the fixed logic circuit, to the interconnect resources, and to the non-volatile memory, the ID selector circuit arrangement adapted to, for input to each of at least two input ports of the fixed logic circuit, select between a signal received from the interconnect resources and a signal received from the non-volatile memory.

21. The PLD of claim 19, wherein the fixed logic core is a microprocessor.

* * * * *